(12) United States Patent
Chang et al.

(10) Patent No.: US 12,113,113 B2
(45) Date of Patent: Oct. 8, 2024

(54) SEMICONDUCTOR DEVICE WITH A CORE-SHELL FEATURE AND METHOD FOR FORMING THE SAME

(71) Applicant: Taiwan Semiconductor Manufacturing Company, Ltd., Hsin-Chu (TW)

(72) Inventors: Chih-Chung Chang, Nantou County (TW); Sung-En Lin, Hsinchu County (TW); Chung-Ting Ko, Hsinchu (TW); You-Ting Lin, Hsinchu (TW); Yi-Hsiu Liu, Hsinchu (TW); Po-Wei Liang, Hsinchu (TW); Jiun-Ming Kuo, Taipei (TW); Yung-Cheng Lu, Hsinchu (TW); Chi On Chui, Hsinchu (TW); Yuan-Ching Peng, Hsinchu (TW); Jen-Hong Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 488 days.

(21) Appl. No.: 17/389,142

(22) Filed: Jul. 29, 2021

(65) Prior Publication Data
US 2023/0029739 A1    Feb. 2, 2023

(51) Int. Cl.
*H01L 29/423*    (2006.01)
*H01L 21/8234*    (2006.01)
*H01L 27/088*    (2006.01)
*H01L 29/06*    (2006.01)
*H01L 29/786*    (2006.01)

(52) U.S. Cl.
CPC .......... *H01L 29/42392* (2013.01); *H01L 21/823481* (2013.01); *H01L 27/088* (2013.01); *H01L 29/0665* (2013.01); *H01L 29/78696* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Michelle Mandala
(74) *Attorney, Agent, or Firm* — HAYNES AND BOONE, LLP

(57) ABSTRACT

A semiconductor device includes a pair of fin structures on a semiconductor substrate, each including a vertically stacked plurality of channel layers, a dielectric fin extending in parallel to and between the fin structures, and a gate structure on and extending perpendicularly to the fin structures, the gate structure engaging with the plurality of channel layers. The dielectric fin includes a fin bottom and a fin top over the fin bottom. The fin bottom has a top surface extending above a bottom surface of a topmost channel layer. The fin top includes a core and a shell, the core having a first dielectric material, the shell surrounding the core and having a second dielectric material different from the first dielectric material.

20 Claims, 17 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2022/0344213 A1* | 10/2022 | Lin .................. H01L 29/78696 |
| 2022/0367656 A1* | 11/2022 | Pao ................. H01L 21/823412 |
| 2023/0020933 A1* | 1/2023 | Wang .................... H01L 27/088 |

* cited by examiner

SEMICONDUCTOR DEVICE WITH A CORE-SHELL FEATURE AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor fabrication, hybrid fin structures may be implemented, for example, to separate adjacent source/drain features with opposite conductivity types. In some existing processes, such hybrid fin structures include a bulk top portion configured with high-k dielectric materials to provide the etching resistance beneficial to some certain aspect of the processing. As the scaling down of semiconductor device continues, however, it has become increasingly challenging to fabricate the bulk top portion without defects. Moreover, high cell capacitance associated with the use of high-k dielectric material within the bulk top portion also increasingly contribute to device limitations. Accordingly, although existing hybrid fin structures and processes are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
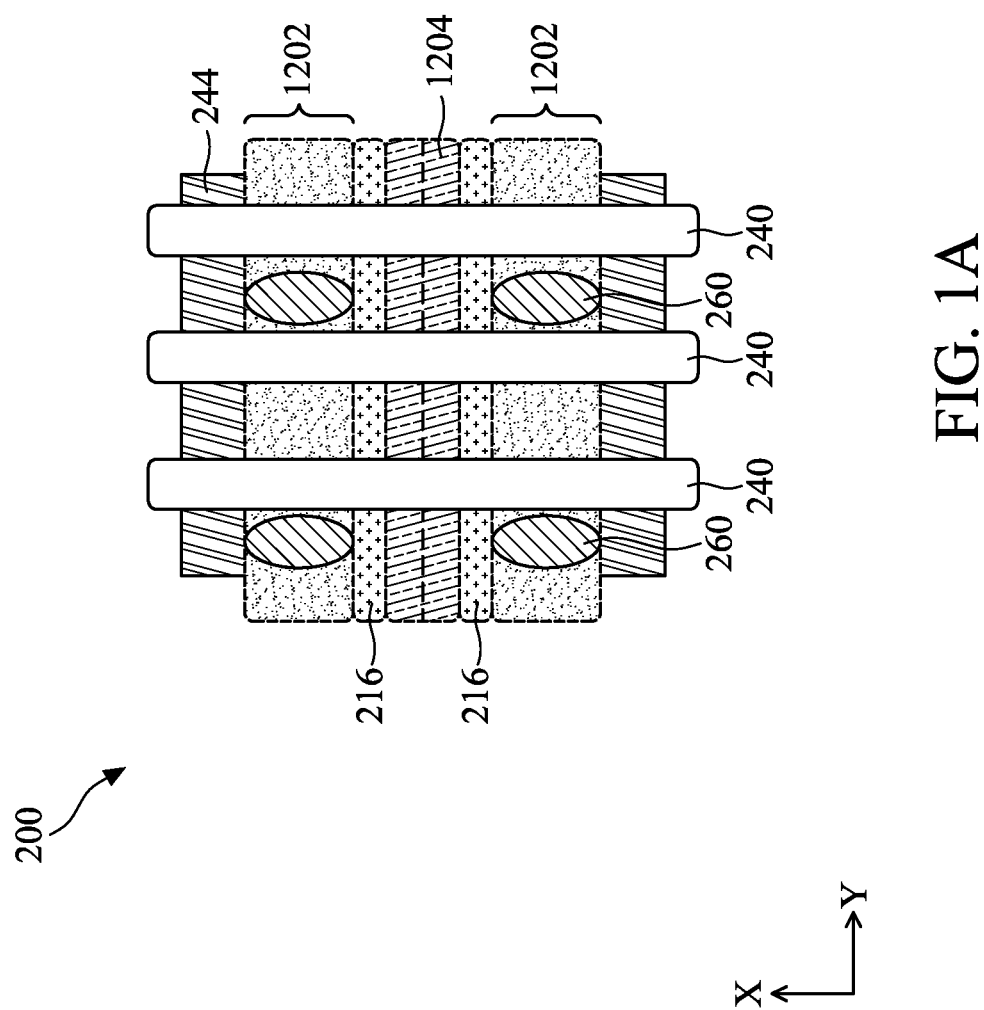
FIG. 1A illustrates a top view of an example semiconductor workpiece, at an intermediate processing stage of the present disclosure according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations.

The present disclosure is generally related to ICs and semiconductor devices as well as methods of forming the same. More particularly, the present disclosure is related to hybrid fin structures for ICs and semiconductor devices. In semiconductor fabrication, hybrid fin structures may be implemented, for example, to separate adjacent source/drain features with opposite conductivity types, and/or to separate adjacent gate portions. In some existing processes, such hybrid fin structures include a bulk top portion configured with high-k dielectric materials to provide the etching resistance beneficial to some aspects of the processing. As the scaling down of semiconductor device continues, however, it has become increasingly challenging to fabricate the bulk top portion without defects. Moreover, high cell capacitance associated with the use of high-k dielectric material within the bulk top portion also increasingly contribute to device limitations. Accordingly, although existing hybrid fin structures and processes are generally adequate for their intended purposes, they are not satisfactory in all aspects. The present disclosure provides hybrid fin structures that, unlike existing technologies, include a core-shell structured top portion. In some embodiments, the top portion includes two dissimilar materials, with one wrapping around the other. For example, the core-shell structured top portion may include a low-k dielectric material inside, and a high-k dielectric material outside. Such core-shell structured top portion provides satisfactory etch resistance and further allow for reduced cell capacitances and reduced defect rates. Embodiments of the present disclosure may therefore continue the scaling down with improved device characteristics.

In one example, the present disclosure may be implemented in the fabrication of nanosheet-based semiconductor devices. For example, methods described here may be used to form an intermediate workpiece that is subsequently converted into a nanosheet-based semiconductor device. In that regard, nanosheet-based devices (sometimes interchangeably referred to as gate-all-around (GAA) devices, multi-bridge-channel (MBC) devices, surrounding gate transistor (SGT), or other similar names) include a plurality of channel layers stacked one on top of another. The channel layers of a nanosheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nanosheet-based devices broadly encompasses devices having channel layers in nanowire, nano-bars, and any other suitable shapes. The channel layers connect a pair of source/drain features such that the charge carriers may flow from the source region to the drain region through the channel layers during the operation (such as when the transistors are turned on). The nanosheet-based devices formed from the workpieces described here or according to the methods described here may be implemented as complementary metal-oxide-semiconductor (CMOS) devices, p-type metal-oxide-semiconductor (PMOS) devices, or n-type metal-oxide-semiconductor (NMOS) devices. One of ordinary skill may recognize other examples of semiconductor devices that may benefit from aspects of the present disclosure. Moreover, although the disclosure uses nanosheet-based devices as an example, one of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figure 1B:
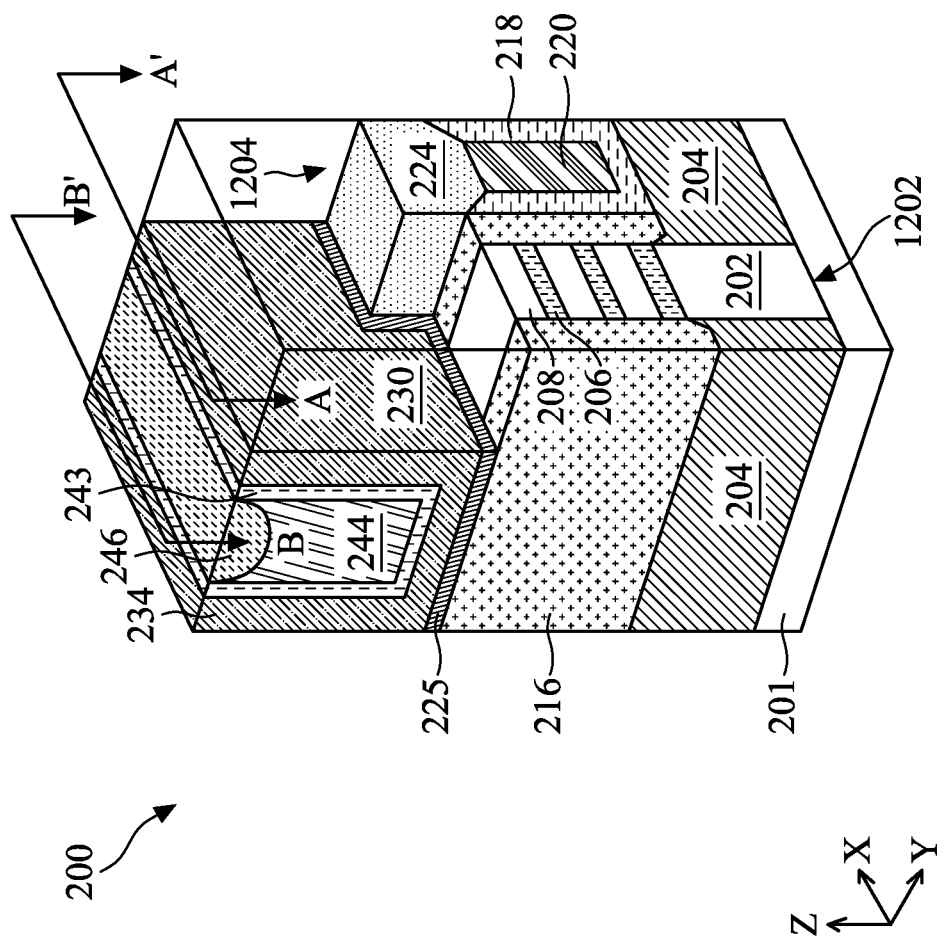
FIGS. 1B, 11B, and 12B illustrate a three-dimensional (3D) view of a workpiece of the present disclosure, during a fabrication process of the present disclosure according to one or more aspects of the present disclosure.
Figure 2:
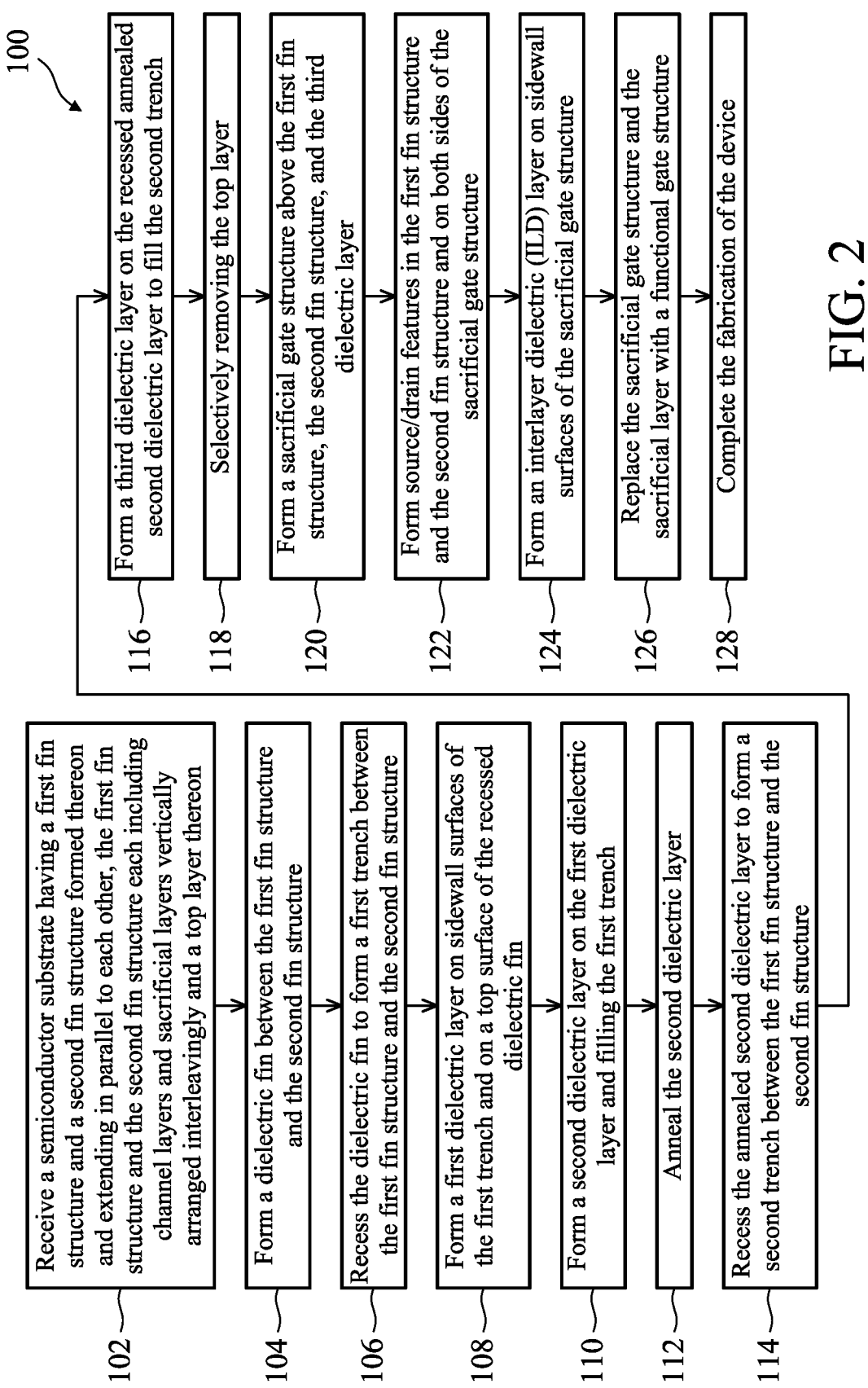
FIG. 2 illustrates a flow chart of a method for forming a semiconductor device of the present disclosure, according to one or more aspects of the present disclosure.

The various aspects of the present disclosure will now be described in more details with reference to the figures. In that regard, FIG. 1A illustrates a top view of an example semiconductor workpiece of the present disclosure, at an intermediate processing stage of the present disclosure, according to one or more aspects of the present disclosure. FIG. 1B illustrates a three-dimensional (3D) view of a workpiece of the present disclosure, at an intermediate processing stage of the present disclosure, according to one or more aspects of the present disclosure. FIG. 2 illustrates a flow chart of a method 100 for forming a semiconductor device of the present disclosure, according to one or more aspects of the present disclosure. Method 100 is merely an example and is not intended to limit the present disclosure to what is explicitly illustrated in method 100. Additional steps may be provided before, during, or after method 100, and some steps described can be replaced, eliminated, or moved around for additional embodiments of the method. Not all steps are described herein in detail for reasons of simplicity. Method 100 is described below in conjunction with FIGS. 3-10, 11A-12A, 11B-12B, and 11C-12C which are 3D views or fragmentary cross-sectional views of a workpiece (along the A-A' line or the B-B' line of FIG. 1B) at various intermediate processing stages of a fabrication process according to the method of FIG. 2, according to one or more aspects of the present disclosure. Because the workpiece 200 will be fabricated into a semiconductor device upon conclusion of the fabrication processes, the workpiece 200 may be interchangeably referred to as the semiconductor device (or device) 200 as the context requires. Additionally, throughout the present application, like reference numerals denote like features, unless otherwise provided.

The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

FIGS. 1A and 1B illustrate an example workpiece 200 that is subsequently processed into a nanosheet-based semiconductor device 200. The workpiece 200 includes a semiconductor substrate 201, and a plurality of fin structure 1202 protruding from a top surface of the semiconductor substrate 201, where each of the plurality of fin structure 1202 include channel layers 208 and sacrificial layers 206 stacked one over another and above a base fin structure 202. Isolation features 204 are formed between adjacent base fin structures 202. Moreover, hybrid fin structures 1204 are formed between and separating adjacent fin structures 1202. Dummy gate stacks 230 are formed over the fin structures 1202, as well as over the hybrid fin structures 1204, for example, with an orientation perpendicular to that of the fin structures 1202. Gate spacers 234 are formed on sidewalls of the dummy gate stacks 230. Source/drain features 260 are then formed on both sides of the gate spacers 234 such that the channel layers 215 connect the source/drain features 260. An etch stop layer 243 is formed over the device, and an interlayer dielectric layer 244 is formed on the etch stop layer 243. Accordingly, as illustrated, the hybrid fin structures 1204 separate the source/drain features 260 on adjacent fin structures. Moreover, in some approaches, the hybrid fin structures 1204 serve to form gate cut features that isolate each gate electrode into multiple segments (sometimes referred to as gate portions).

Figure 3:
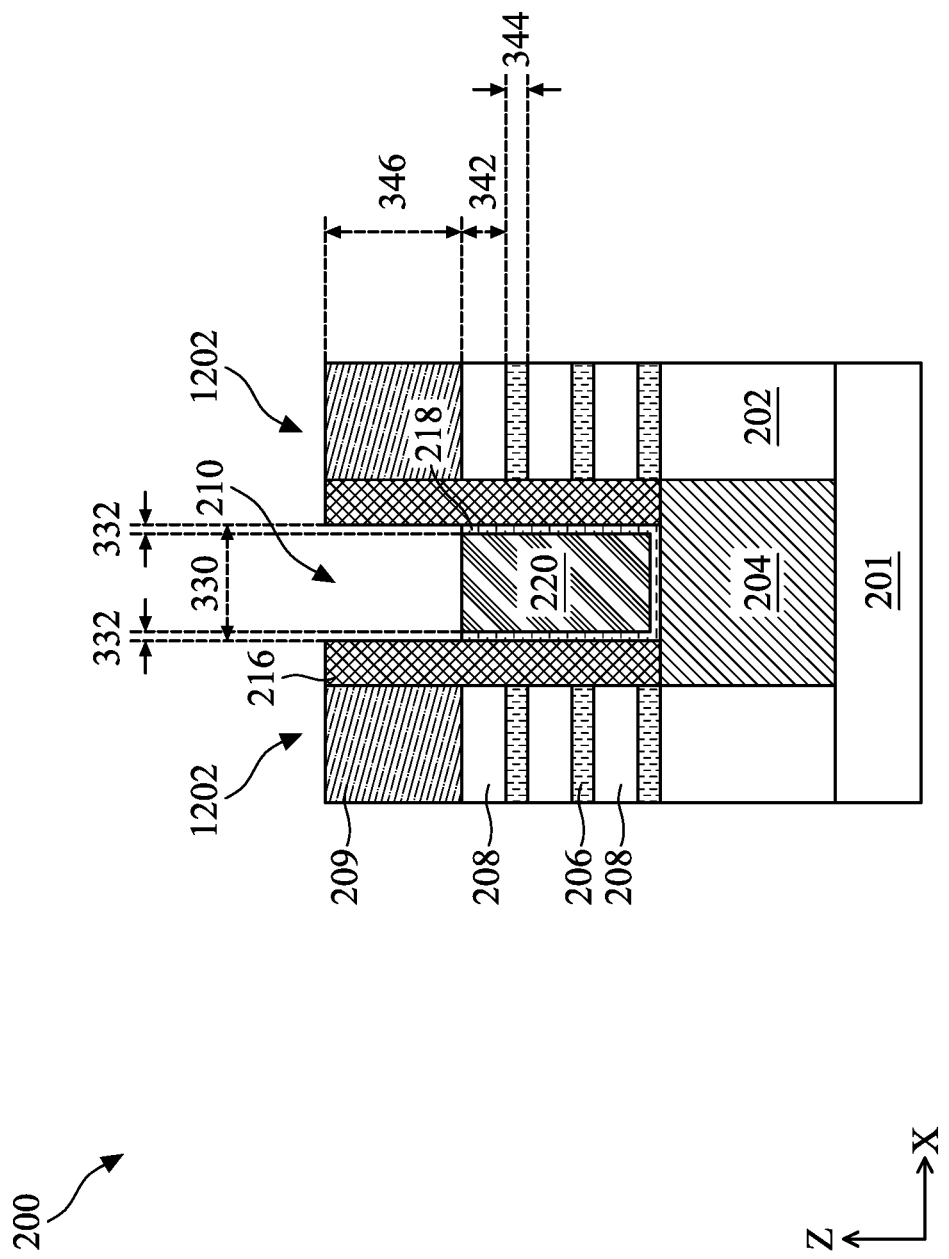
FIGS. 3, 4, 5, 6, 7, 8, 9, 10, 11A, and 12A are fragmentary cross-sectional views of a workpiece (along the A-A' line of FIG. 1B) during a fabrication process according to the method of FIG. 2, according to one or more aspects of the present disclosure.

Referring to block 102 of FIG. 2 and to FIG. 3, an initial structure for the workpiece 200 is received. The workpiece 200 includes a substrate 201. In one embodiment, the substrate 201 includes silicon (Si). In other embodiments, the substrate 201 may also include other semiconductor materials such as germanium (Ge), silicon carbide (SiC), silicon germanium (SiGe), or diamond. The workpiece 200 includes a base fin 202 which may be patterned from the substrate 201 and may share the same composition as the substrate 201. The base fins 202 are spaced apart from one another by an isolation feature 204. In some embodiments, the isolation feature 204 is deposited in trenches between the base fins 202 and surrounds the base fins 202. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

The workpiece 200 includes a plurality of vertically stacked channel layers 208 over the base fins 202. In the depicted embodiments, three (3) vertically stacked channel layers 208 are disposed over respective base fins 202, which is for illustrative purposes only and not intended to be limiting. The channel layers 208 may be formed of a semiconductor material that is similar to the material of the substrate 201. In one embodiment, the channel layers 208 may include silicon (Si), such as single crystal Si. The channel layers 208 are vertically spaced apart from one another, and further spaced apart from the substrate 201, by sacrificial layers 206. The material composition of the sacrificial layers 206 are such that an etching selectivity may be achieved in a subsequent channel release process. For example, in such channel release process, the sacrificial layers 206 may be removed entirely without substantially affecting the channel layers 208. In some embodiments, the sacrificial layers 206 includes silicon germanium (SiGe). In some embodiments, the channel layers 208 each have a thickness 342 that is about 4 nm to about 12 nm. If the thickness 342 of the channel layer 208 is too small, the resistances may be too high; if the thickness 342 is too large, gate control of the middle portions of the channel layers 208 may be weak. In some embodiments, the sacrificial layers 206 each have a thickness 344 that is about 4 nm to about 12 nm. If the thickness 344 is too small, there may not be sufficient space to form gate layers therein; if the thickness 344 is too large, any additional benefit may not justify the increased material and processing cost. The channel layers 208, the sacrificial layers 206, and the base fins 202 collectively form fin structures 1202. The fin structures 1202 are partially separated from each other by the isolation feature 204. Moreover, in some embodiments, the fin structures 1202 each further include a top layer 209 on top surface of the topmost channel layer 208. The top layer 209 may protect the topmost channel layer 208 in a subsequent processing. In some embodiments, the top layer 209 may include silicon (Si), silicon germanium (SiGe), silicon nitride (SiN), other suitable materials, or combinations thereof. Where the top layer 209 includes Si, the top layer 209 and the topmost channel layer 208 is separated by a sacrificial layer 206. The top layer 209 has a thickness 346. In some embodiments, the thickness 346 may be about 20 nm to about 40 nm. If the height 346 is too large, subsequently formed source/drain contact may possess high resistances. Conversely, if the height 346 is too low, a subsequently formed core-shell feature may be restricted to the height 346 and may not meet the design need.

Still referring to FIG. 3, the initial structure of the workpiece 200 further includes a cladding layer 216 on sidewall surfaces of the channel layers 208 and the sacrificial layers 206. In some embodiments, the cladding layer 216 may have a composition similar to that of the sacrificial layers 206. This common composition allows efficient selective removal of the sacrificial layers 206 and the cladding layer 216 without adversely affect the channel layers 208 (such as formed of Si) in a subsequent process. In one example, the cladding layer 216 may be formed of SiGe. In some embodiments, the cladding layer 216 may be conformally and epitaxially grown using VPE or MBE, and subsequently etched back to remove portions on top of the fin structures 1202 as well as on top of the isolation features 204. In some alternative embodiments, the cladding layer 216 may be deposited using CVD, ALD, other suitable deposition method, or combinations thereof. An example etch back process may be a dry etch process that includes use of plasma of hydrogen bromide (HBr), oxygen ($O_2$), chlorine ($Cl_2$), or mixtures thereof. In some instances, the cladding layer 216 may have a thickness between about 5 nm and about 10 nm. In some embodiments, the sidewall surfaces of the cladding layer are spaced away from each other by a distance 330. In some embodiments, the distance 330 may be about 10 nm to about 50 nm, based on design needs.

Referring to block 104 of FIG. 2 and still referring to FIG. 3, a dielectric layer 218 is formed on sidewall surfaces of the cladding layer 216, as well as on the top surface of the isolation features 204. In some embodiments, the dielectric layer 218 may include a material having a dielectric constant (or k value) that is greater than about 7. Accordingly, the dielectric layer 218 may alternatively be referred to as the high-k dielectric layer 218. In some embodiments, the dielectric layer 218 may include hafnium oxide ($HfO_2$), hafnium zirconium oxide (HfZrO), tantalum oxide ($Ta_2O_5$), hafnium silicon oxide ($HfSiO_x$), hafnium aluminum oxide ($HfAlO_x$), zirconium oxide ($ZrO_2$), aluminum oxide ($Al_2O_3$), other suitable high-k materials, or combinations thereof. In some embodiments, the dielectric layer 218 is formed by conformally depositing the high-k dielectric material on top surfaces of the workpiece 200. In some embodiments, the dielectric layer 218 may be a conformal layer having a thickness 332. In some embodiments, the thickness 332 may be about 2 nm to about 6 nm. If the thickness 332 is too small, it may possess reduced efficacy in affording protection to features subsequently formed; if the thickness 332 is too large, it may unnecessarily increase the k value and ultimately the device capacitance.

Furthermore, another dielectric layer 220 is formed on and between portions of the dielectric layers 218. In other words, the dielectric layers 218 and 220 collectively fills or partially fills the space between adjacent fin structures 1202. Accordingly, the dielectric layer 220 may have a width corresponding to a difference between the distance 330 and twice the thickness 332. In some embodiments, the dielectric layer 220 may include a dielectric material having a k value that is less than about 7, and may sometimes be interchangeably referred to as the low-k dielectric layer 220. For example, in some embodiments, the dielectric layer 220 may include silicon carbonitride (SiCN), silicon oxycarbide (SiOC), silicon oxycarbonitride (SiOCN). In some embodiments, a chemical mechanical polishing operation (CMP) is conducted to remove materials on and above the top surfaces of the top layer 209, and planarize the top surface of the workpiece 200. Accordingly, portions of the dielectric layer 218 on top surfaces of the top layer 209 is removed.

Referring to block 106 of FIG. 2 and still referring to FIG. 3, the dielectric layers 218 and 220 are vertically recessed such that top surfaces of the dielectric layers 218 and 220 extend lower than the top surfaces of the top layer 209, thereby forming trenches 210 therebetween. In some embodiments, the recessed surfaces of the dielectric layers 218 and 220 extend along with or above a bottom surface of the top layer 209. In other words, the top surfaces of the recessed surfaces of the dielectric layers 218 and 220 extend approximately along or above a top surface of the topmost channel layer 208. As will be described, a core-shell feature is subsequently formed in the trench 210 and on the recessed dielectric layers 218 and 220. The core-shell feature serves to isolate source/drain features on adjacent fin structures 1202. In some circumstances, having the interface between the core-shell feature and the dielectric layers 218 and 220 at this height level relative to the channel layers allow proper position of core-shell feature. The core-shell feature and the dielectric layers 218 and 220 collectively form a portion of the hybrid fin structure, as described later.

Figure 4:
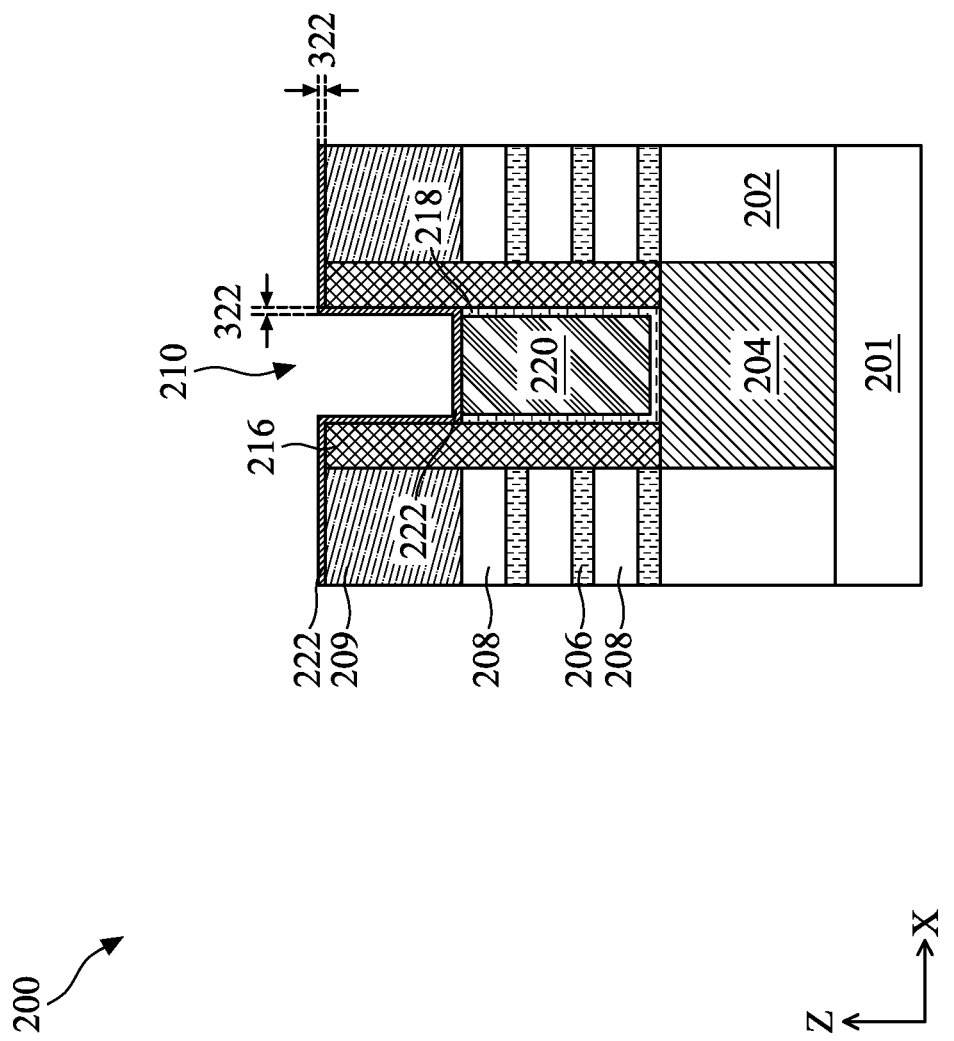

Referring to block 108 of FIG. 2 and to FIG. 4, a dielectric layer 222 is formed on sidewall surfaces of the trenches 210 between the adjacent top layers 209. As described above, the sidewall surfaces of the top layers 209 are covered with the cladding layers 216. Accordingly, the dielectric layer 222 is formed on sidewall surfaces of the cladding layer 216. Moreover, the dielectric layer 222 is formed on top surfaces of the recessed dielectric layer 220 and 218. In some embodiments, the dielectric layer 222 may be a high-k dielectric layer. In some embodiments, the dielectric layer 222 protects the dielectric layer 220 therebeneath during subsequent etching operations (e.g. during a source/drain trench formation process) thereby prevent bridging between adjacent features (such as adjacent source/drain features). In some embodiments, the materials of the dielectric layer 222 may be the same as or similar to that of the dielectric layer 218, but different from that of the dielectric layer 220. In some embodiments, the dielectric layer 222 may include hafnium oxide ($HfO_2$), hafnium zirconium oxide (HfZrO), tantalum oxide ($Ta_2O_5$), hafnium silicon oxide ($HfSiO_x$), hafnium aluminum oxide ($HfAlO_x$), zirconium oxide ($ZrO_2$), aluminum oxide ($Al_2O_3$), other suitable high-k materials, or combinations thereof. In some embodiments, the dielectric layer 222 is a conformal layer having a thickness 322. In other words, the dielectric layer 222 may have vertical portions and horizontal portions, each having the thickness 322. In some embodiments, the thickness 322 is about 0.5 nm to about 5 nm. In some embodiments, the thickness 322 is about 1 nm to about 2 nm. As will be described later, the dielectric layer 222 serves as the shell of the core-shell features, and protects the core of the core-shell feature from damages. If the thickness 322 is too small, processing anomalies may lead to inconsistent coverage of the core, thereby adversely affect its protection efficacy. Conversely, if the thickness 322 is too large, the core part of the core-shell structure may be too small. As described later, a larger core reduces the cell capacitance. Accordingly, with an excessively large thickness 322, the capacitance cannot be maximally reduced. Any suitable method may be implemented to form the dielectric layer 222. In some embodiments, the dielectric layer 222 is formed using a PVD, CVD, ALD, other suitable deposition methods, or combinations thereof. In some embodiments, the dielectric layer 222 further covers the top surfaces of the top layer 209. The formation of the dielectric layer 222 partially fills the trenches 210, and reduces the lateral dimension thereof.

Figure 5:
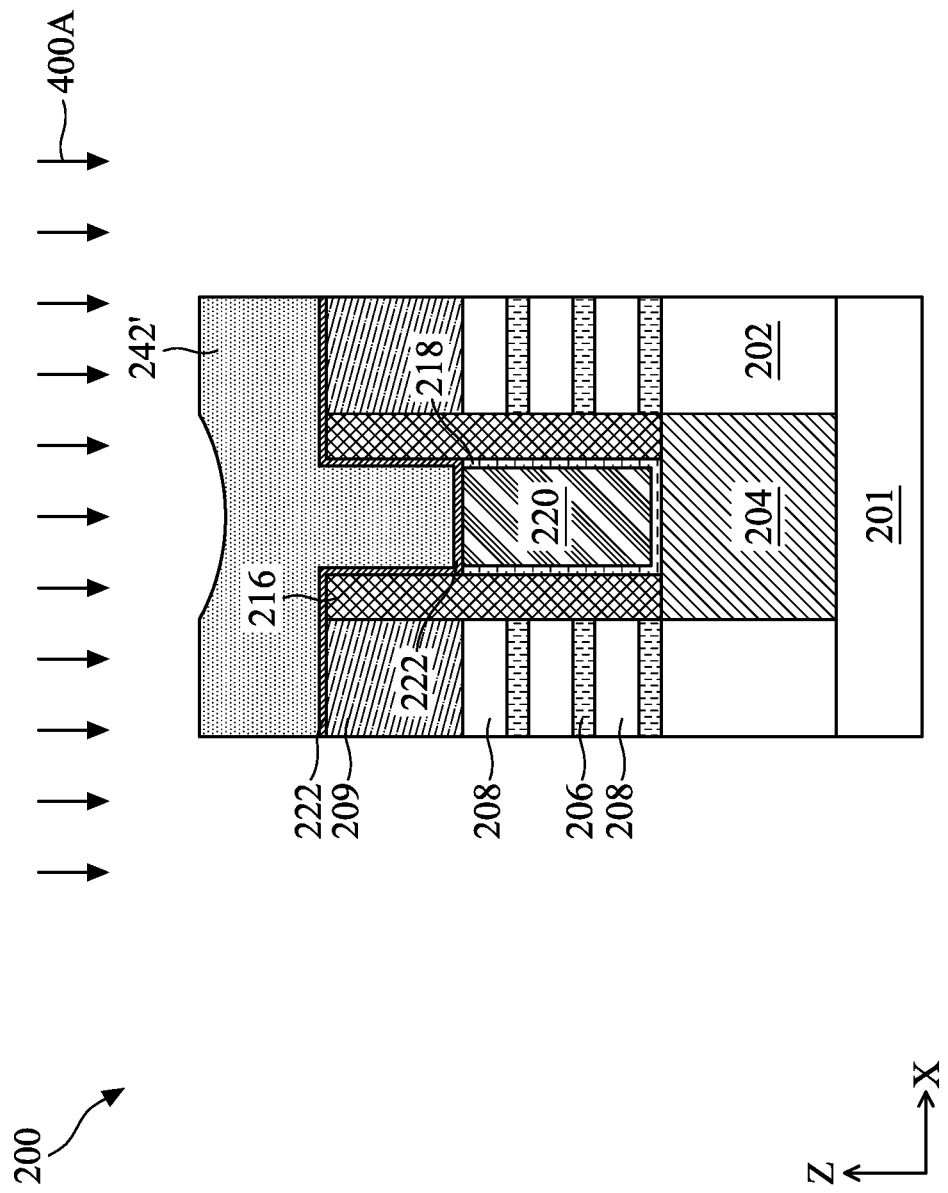

Referring to block 110 of FIG. 2 and to FIG. 5, a material layer 242' is formed to fill the trenches 210. Accordingly, the material layer 242' is formed on and interfacing with the dielectric layer 222. In some embodiments, the material layer 242' extends above a top surface of the dielectric layer 222. In some embodiments, the material layer 242' may include silicon (Si), oxygen (O), carbon (C), nitrogen (N), hydrogen (H), or combinations thereof. In some embodiments, the material layer 242' may be configured with a flowable characteristics. In other words, the material layer 242' may have characteristics that resembles a liquid in certain aspects. Accordingly, the material layer 242' may be interchangeably referred as the flowable material layer 242'. In some embodiments, implementing the material layer 242' having the flowable characteristics eases the challenges in fully filling such high-aspect ratio trenches in advanced technology nodes, due to its improved gap filling capability, thereby reduces the risk of void formation therein. Any suitable methods may be implemented to form the material layer 242'. In some embodiments, a silicon-containing precursor may be introduced to the reaction chamber. The silicon-containing precursor may include a polysilazane (such as a perhydropolysilazane, an organopolysilazanes), a silylamine (such as trisilylamine (TSA), disilylamine (DSA)), other suitable precursors, or a combination thereof. A co-reacting precursor is provided to the same reaction chamber. In some embodiments, the co-reacting precursor includes $NH_3$, $N_2$, $O_2$, $H_2O$, $O_3$, other suitable, co-reacting precursors, or a combination thereof. In some embodiments, the silicon-containing precursor and/or the co-reacting precursor may be introduced with a carrier gas selected from, helium, argon, nitrogen ($N_2$), other suitable carrier gases, or a, combination thereof. In some embodiments, reactions between the silicon-containing precursor and the co-reacting precursor may be initiated by a remote plasma process to form the material layer 242'. In some embodiments, the material layer 242' is cured using an ultra-violet (UV) assisted curing process.

At this processing stage, the material layer 242' may include Si—O—Si bonds, Si—OH subunits, along with a large amount of Si—NH subunits. In some embodiments, the as-deposited material layer 242' may have very low density and low structural rigidity insufficient to serve as part of the hybrid fin structure. Accordingly, referring to block 112 of FIG. 2, the annealing operation 400A is conducted to improve the mechanical, characteristics of the material layer 242', in some embodiments, the annealing operation 400A starts (but does not complete) the conversion of the material layer 242' into the dielectric layer 242 having improved mechanical characteristics, in some embodiments, the annealing operation 400A may be conducted at a temperature T1 of about 375° C. to about 425° C. If the temperature is too low, the efficacy of the annealing process may suffer; conversely, if the temperature is too high, the annealed material may be excessively densified such that it has a k value that is too high. This may lead to unoptimized device capacitance. In some embodiments, the annealing process may be performed for a duration t1 of about 2 hours to about 6 hours. If the time duration is too short, the improvement to the structural rigidity and/or mechanical strength may be insufficient; conversely, if the time duration is too long, excessive amount of crosslinking may occur such that the dielectric layer 242 may have a k-value that is too high. Moreover, in some embodiments, the annealing operation 400A is conducted in presence of water steam. Accordingly, this step of the annealing operation 400A may be referred to as a wet annealing step. In some embodiments, this wet annealing step causes the amine groups to be substituted with hydroxy groups. For example, a substitution reaction is promoted between the water vapor and the amine groups tethered to the Si atoms, such that hydroxy groups replace the respective amine groups. Accordingly, spectral signatures for the amine group may be reduced while spectral signatures for the hydroxy group increases as compared to prior to the annealing operation 400A. Moreover, amount of Si—N bonds (such as Si—NH) may reduce, while Si—O bonds (such as Si—OH) may increase. In some embodiments, nitrogen gas ($N_2$) may be detected as a byproduct of the process 400A. In some embodiments, ammonia ($NH_3$)) may be detected as a byproduct of the process. Because the amine groups are substituted with hydroxy groups in this step, this wet annealing step may be referred to as a substitution step, or a hydroxylation step. In some embodiments, the annealing operation 400A is configured to induce minimal, if any, crosslinking between Si—NH subunits or between Si—OH subunits. Moreover, in some embodiments, the annealing operation 400A is configured to induce minimal, if any, Si—O bond (e.g. Si-G-Si bond) cleavages. In other words, the polymeric framework of the material layer 242' remain largely unchanged before and after the annealing operation 400A. Furthermore, the density of the flowable material layer 242' also remain largely unchanged. For example, a difference in density of the material layer 242' before and after the annealing operation 400A may be less than about 20%. If the density change is greater than about 20%, it indicates that substantial reconstruction of the polymeric framework has occurred. In such circumstances, the dielectric layer 242 subsequently formed may have a k value that is too high. In some embodiments, the annealing operation 400A is an isotemperature annealing operation. In other words, the temperature T1 is configured to stay at a single value, or have a variation less than about ±10° C. If the temperature variation is too large, as described later, the subsequently formed dielectric layer 242 may be too dense and have too high a k value.

Figure 6:
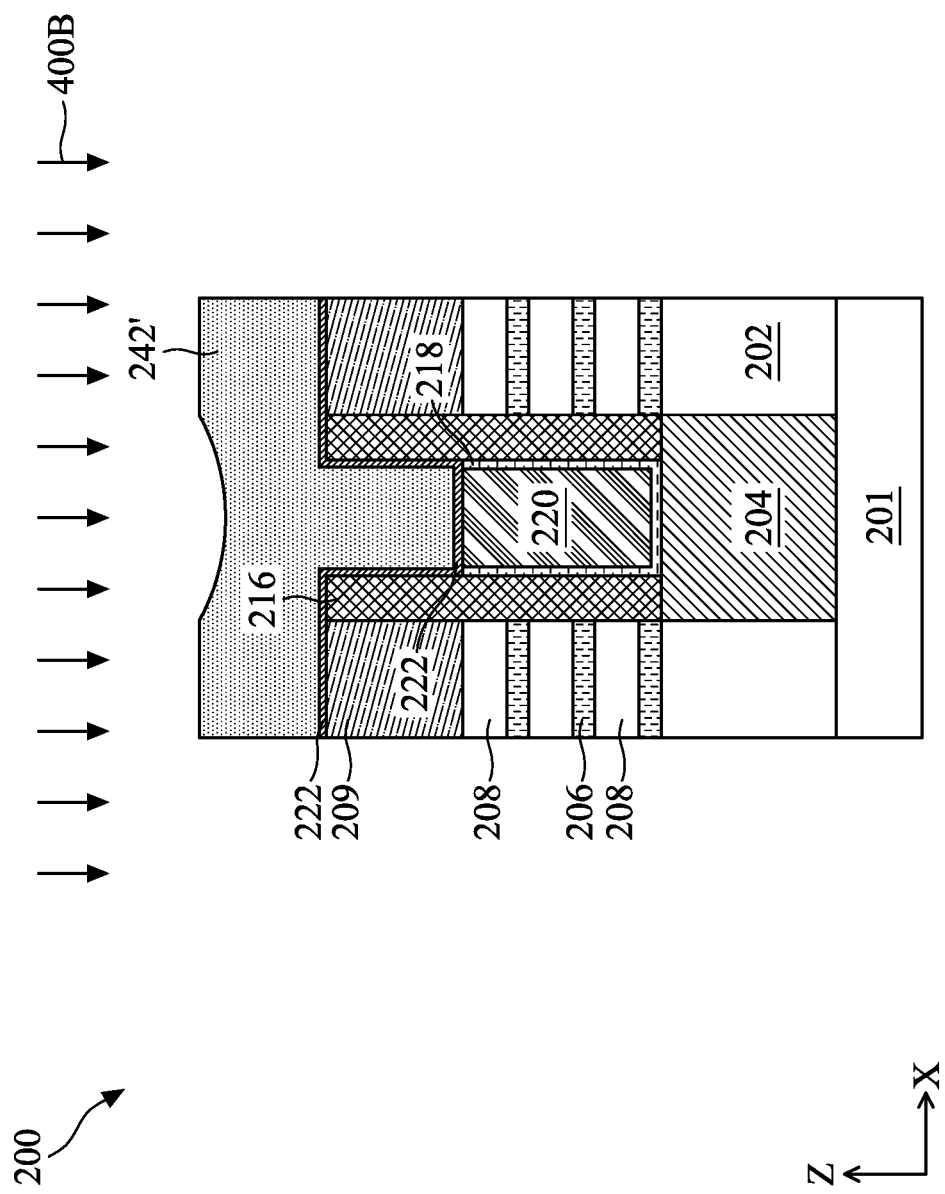
Figure 7:
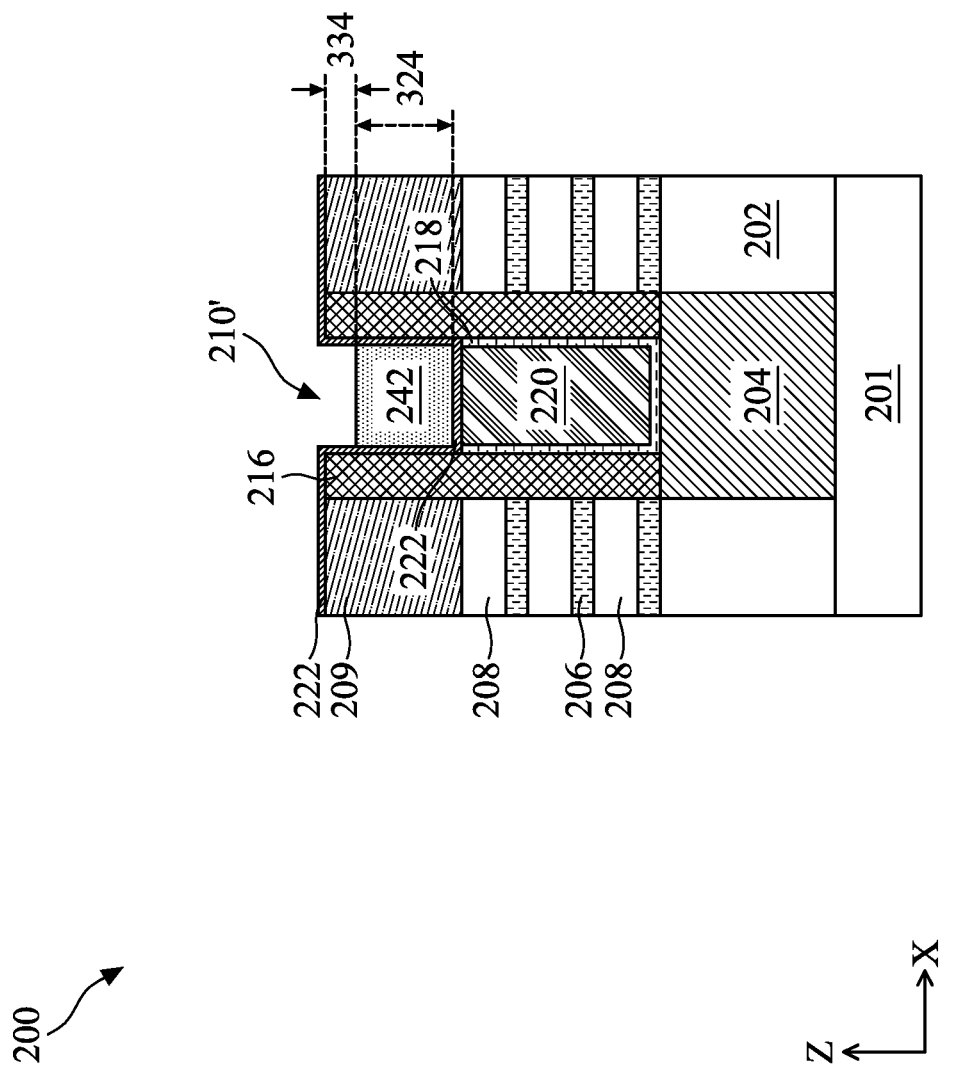

Still referring to block 112 of FIG. 2 and to FIG. 6, in some embodiments, a second annealing operation 400B may be performed subsequent to the annealing operation 400A. The annealing operation 400B completes the conversion of the material layer 242' into the dielectric layer 242. In some embodiments, the second annealing operation is conducted in absence of steam. Accordingly, this second annealing operation may be referred to as a dry annealing operation 400B. In some embodiments, the dry annealing operation is configured to induce de-hydration reaction between adjacent Si—OH subunits to form Si—O—Si bonds. For example, hydroxy groups of the adjacent Si—OH subunits condense with each other to form the Si—O—Si bond along with water as a byproduct. As a result, the density of the material layer 242' increases. Accordingly, the dry annealing operation 400B may be referred to as a densification step. In some embodiments, a higher annealing temperature T2 is implemented, as compared to the temperature T1 of the annealing operation 400A. In some embodiments, the temperature T2 may be about 675° C. to about 725° C. In some embodiments, a temperature difference between the T2 and T1 is about 250° C. to about 350° C. If the temperature T2 is too low or if the temperature difference is too large, there may not be sufficient crosslinking between adjacent Si—OH subunits to form Si— O—Si groups. Accordingly, the mechanical strength of the dielectric layer 242 so prepared may not be sufficient. If the temperature T2 is too high, or if the temperature difference is too small, the k-value of the dielectric layer 242 may be too high, such that the device capacitance may not be maximally reduced. In some embodiments, the annealing operation 400B may be performed for a time duration t2 of about 30 minutes to about 2 hours. In other words, the annealing time duration of the annealing operation 400B is less than that of the wet annealing operation. In some embodiments, a ratio of the time duration of the annealing operation 400B to the time duration of the annealing operation 400A may be about 1:3 to about 1:5. If the time duration is too small, or if the ratio is too small (such as less than about 1:5), the annealing operation may not be sufficiently efficient; conversely, if the time duration is too long, or if the ratio is too large (such as greater than about 1:3), excessive amount of crosslinking may occur such that the dielectric layer 242 so prepared may have a k-value that is too high, in some embodiments, at the end of the annealing operations 400A and 400B implemented as described above, amine groups (or other nitrogen-containing and/or hydrogen-containing groups) may not be entirely removed. Accordingly, nitrogen atoms and hydrogen atoms may remain within the dielectric layer 242. Moreover, the annealing operations 400A and 400B removes the flowable characteristics of the material layer 242'.

In some approaches not implementing embodiments of the present disclosure, another wet annealing operation step may be conducted between the above-described annealing operation 400A (substitution step) and annealing operation 400B (densification step). For example, after the annealing operation 400A and prior to the annealing operation 400B, a second wet annealing operation is conducted. The second wet annealing operation may be conducted in presence of steam. For example, such second wet annealing operation may be conducted at a temperature between about 450° C. and about 650° C. The additional wet annealing step may induce extensive hydration-induced bond cleavages (such as Si—O—Si bond cleavages to form Si—OH bonds). For example, water vapor may react with Si—O—Si bonds to form two Si—OH subunits. As a result, the Si—O—Si bond is cleaved. Stith bond cleavages may also lead to silicon-oxygen chains to be shortened and/or silicon-oxygen rings to be cut open. In other words, the polymeric framework of the material layer 242' is significantly reconstructed. In some circumstances, these cleavage of the Si—O—Si bonds and ring-opening reactions produce substantially shortened silicon chains and/or substantially reduced frictions between adjacent silicon chains. Accordingly, during the subsequent dry annealing step (e.g. the annealing operation 400B), much more organized silicon oxide (or much denser silicon oxide with minimal defects) may be achieved. Such denser silicon oxide, although possess increased mechanical strength, may also possess a k-value that is too high to lead to the desired optimized device capacitance. By contrast, according to the embodiments of the present disclosure, such re-construction annealing step is intentionally omitted, so as to achieve the well-calibrated balance between the structural strength and low device capacitance. Alternatively, in some approaches not implementing embodiments of the present disclosure, a single wet annealing operation may be conducted at a temperature greater than T1, such as at greater than about 425° C., and/or for a time duration greater than t1, such as longer than about 6 h. Such an approach may similarly cause reconstruction of the material layer 242', and similarly lose the balance described above. Accordingly, such reconstructions are avoided according to embodiments of the present disclosure. In other words, the densification step follows the substitution step without an intervening reconstruction step.

Accordingly, at the conclusion of the annealing operation 400B, the dielectric layer 242 is formed. The dielectric layer 242 formed according to the embodiments described herein may have a k value that is less than conventional silicon oxides implemented in hybrid fin structures. For example, the dielectric material of the dielectric layer 242 may have a k value that is significantly less than that of silicon oxide (which is about 3.9). If the k value is too large, such as greater than 3.9, the cell capacitance may not be maximally reduced, and device characteristics (such as speed) may not be maximally improved. In some embodiments, the quality of the dielectric layer 242 may be evaluated using a wet etching testing method. In some embodiments, because of the unique processing method implemented for its preparation, the dielectric layer 242 may exhibit an increased etching rate as compared to dielectric layers otherwise achieved. For example, in some embodiments, the dielectric layer 242 may be etched at an etch rate greater than about 75

Å/min; while under the same condition, a silicon oxide layer not implementing the present disclosure may have an etch rate of about 55 Å/min to about 75 Å/min. In other words, by implementing methods of the present disclosure, the wet etching rate increases. In some embodiments, under the above-described testing condition, the layer 242 may be removed at an etch rate of about 80 Å/min to about 100 Å/min. In some embodiments, this increased etching rate is an indicator (or index) for the k-value of the dielectric layer 242. In some embodiments, if the etching rate is too small, the k-value of the material may be too high to reach the desired low device capacitance. Of course, this wet etching condition is merely an example to illustrate the unique characteristics of the dielectric layer 242. Any other suitable testing condition may be employed to provide similar comparison against materials otherwise prepared.

In some embodiments, at the conclusion of the annealing operation 400B, a CMP operation may be conducted to planarize the top surface of the workpiece 200. In some embodiments, the CMP operation is configured to terminate when the dielectric layer 222 is reached, such that the top surfaces of the dielectric layer 222 (e.g. on top of the top layer 209) is exposed. Referring to block 114 of FIG. 2 and to FIG. 7, the dielectric layer 242 is recessed to form trenches 210'. Accordingly, a top surface of the dielectric layer 242 extends below a top surface of the top layer 209. In some embodiments, a distance between the top surface of the top layer 209 and the top surface of the recessed dielectric layer 242 is distance 334. In some embodiments, the distance 334 is about 3 nm to about 15 nm. As described later, another dielectric layer is formed in the trenches 210' to form the top shell of the core-shell features. If the distance 334 is too small, a subsequent CMP operation may remove all or portions of the top shell, such that the core may be exposed. An exposed core (having a low-k dielectric material) is vulnerable to damages in subsequent processing operations. If the distance 334 is too large, the size of the core is not maximized, such that the device capacitance is not maximally reduced. Moreover, if the distance 334 is too large, sometimes, the top surfaces of the dielectric layer 232 may form local grains which adversely affect a subsequent CMP operation. In some embodiments, the recessed dielectric layer 242 may have a height 324. In some embodiments, the sum of the height 334, the height 324, and the thickness 322 may equal the height 346 of the top layer 209.

Although the depicted embodiments illustrate the annealing operations 400A and 400B conducted prior to the CMP operation and recessing operation, in some embodiments, the annealing operation can alternatively be conducted following the recessing operation. In other words, the material layer 242 may be recessed, using any suitable methods, such that a top surface of the flowable material layer 242' extends below the top surface of the top layer 209. Subsequently, the annealing operations 400A and 400B (as described above) may be conducted to the recessed material layer 242' to form the recessed dielectric layer 242.

Figure 8:
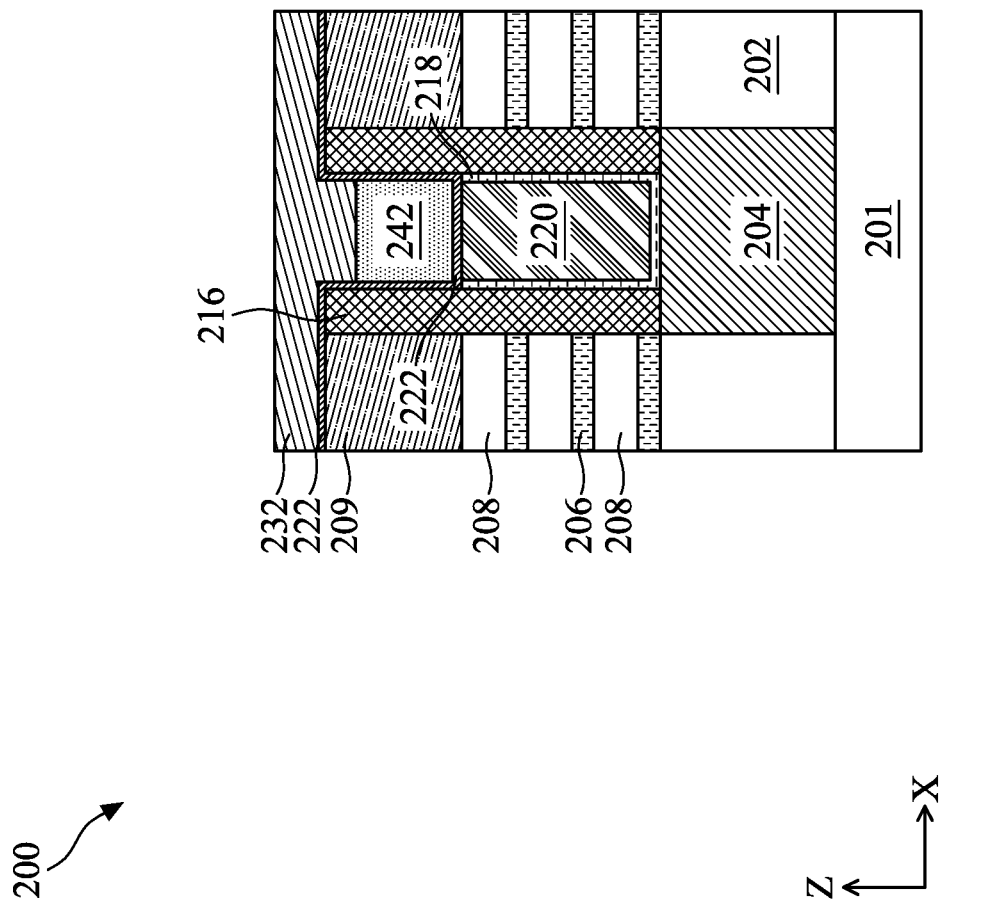

Referring to block 116 of FIG. 2 and to FIG. 8, a dielectric layer 232 is formed on top surfaces and sidewall surfaces of the dielectric layer 222, as well as on top surfaces of the recessed dielectric layer 242. In some embodiments, the dielectric layer 232 includes a high-k dielectric material. In some embodiments, the dielectric layer 232 includes titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. In some embodiments, the dielectric layer 232 has the same material as the dielectric layer 222. In some other embodiments, the dielectric layer 232 has a different material from the dielectric layer 222. In some embodiments, the dielectric layer 232 completely fills the trench 210', and further extends above a top surface of the portion of the dielectric layer 222 above the top layer 209.

Figure 9:
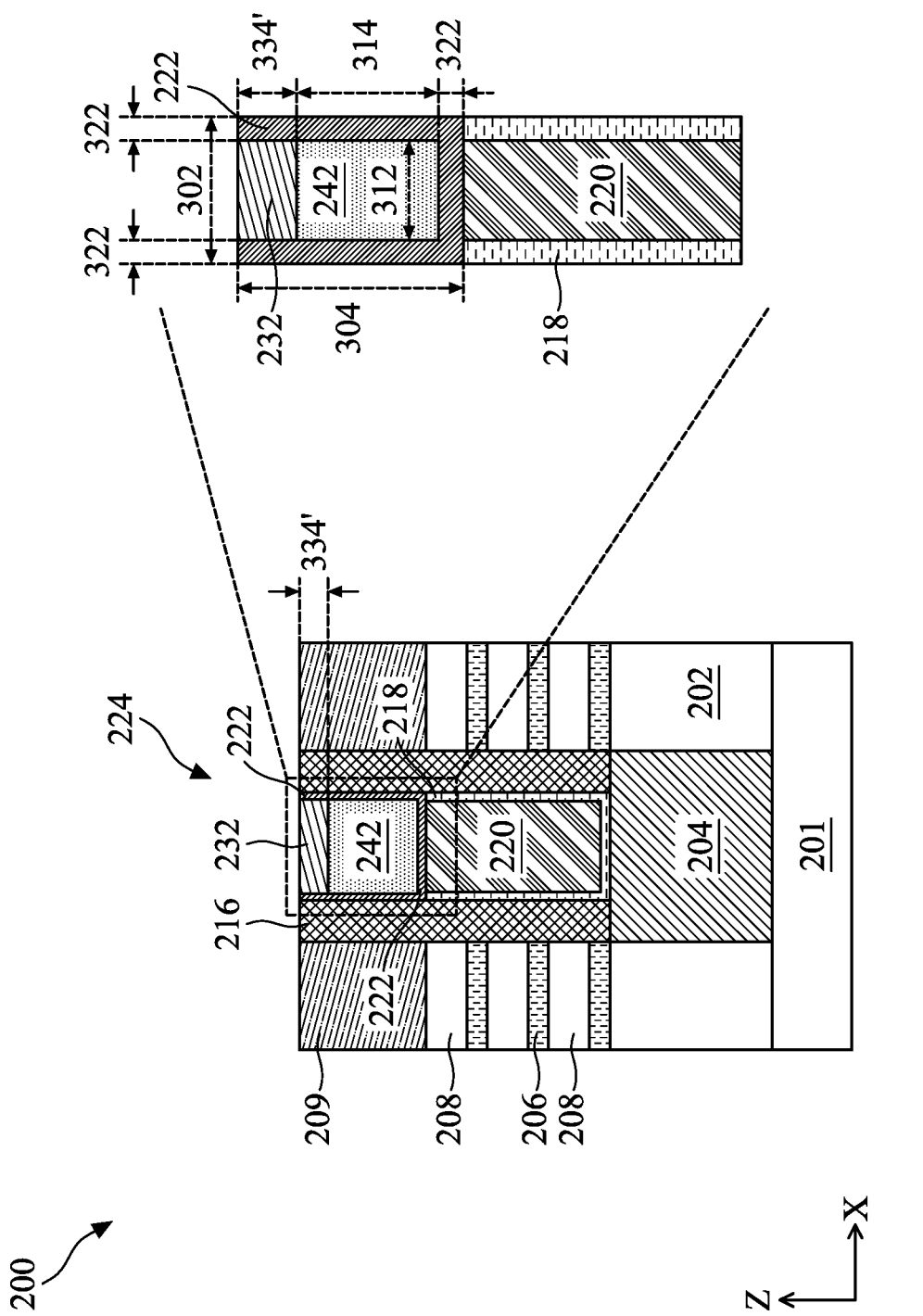

Referring to FIG. 9, a CMP operation is conducted to remove the dielectric layer 232 above the top surface of the top layer 209. For example, the CMP is configured to terminate when the top surface of the top layer 209 is reached. Accordingly, the top surface of the top layer 209 is exposed following the CMP operation. Meanwhile, the dielectric layer 232 above the dielectric layer 242 has a reduced thickness. In some embodiments, the thickness of the recessed dielectric layer 232 above the dielectric layer 242 (or in the previous trench 210') is the thickness 334'. At this processing stage, the dielectric layers 232, 242, and 222 collectively form core-shell feature 224, where the core of the core-shell feature 224 includes the dielectric layer 242, and the shell of the core-shell feature 224 includes the dielectric layers 232 and 222. More specifically, the dielectric layer 232 form the top wall of the shell, and the dielectric layer 222 form the sidewall and bottom wall of the shell. In some embodiments, the dielectric layer 232 and the dielectric layer 222 may have the same material. Accordingly, the core is surrounding by a high-k dielectric material of a uniform composition. The core-shell feature 224 is formed on top surfaces of the dielectric layer 218 and the dielectric layer 220. The core-shell feature 224, along with the dielectric layer 218, and the dielectric layer 220 collectively form the hybrid fin structures 1204. Moreover, the hybrid fin structures 224 are formed on sidewall surfaces of cladding layers 216. In some embodiments, the dimension of the core-shell feature 224 along the X-direction is dimension 302. In some embodiments, fin structures 1202 may have different spacing from each other. Accordingly, the dimension 302 may be different in different areas. In some embodiments, the dimension 302 is about 5 nm to about 50 nm. For example, dimension 302 in a first region may be about 5 nm to about 15 nm; while the dimension 302 in a second region may be about 20 nm to about 50 nm.

Meanwhile, the core-shell feature 224 may have a height dimension 304. In some embodiments, the height dimension 304 may be equal to a sum of the thickness 322 of the dielectric 222, the height 324 of the dielectric layer 242, and the height 334' of the dielectric layer 232. In the depicted embodiments, where the CMP terminates at the top surface of the top layer 209, the height 334' equals to the height 334. Alternatively, in some embodiments, the CMP operation may recess a portion of the top layer 209, such that the dielectric layer 232 may have a thickness less than the thickness 334. Accordingly, the height dimension 304 may be less to a sum of the thickness 322, the height 324, and the height 334. In some embodiments, the height 304 may be about 20 nm to about 30 nm. If the height 304 is too high, subsequently formed source/drain contact may possess high resistances. Conversely, if the height 304 is too low, in some circumstances, subsequently formed source/drain features may merge above top surfaces of the core-shell feature 224, thereby present shorting concerns. In some embodiments, an aspect ratio r of the height 304 to the dimension 302 may be about 0.4:1 to about 3:1. If the aspect ratio is too small, such as less than about 0.4:1, subsequently formed source/drain features may merge above top surfaces of the core-shell feature 224 in some circumstances; if the aspect ratio is too large, such as greater than about 3:1, the subsequently formed source/drain contact may have excessively high resistance.

In some embodiments, a ratio of the dimension 322 to the dimension 334 may be about 1:1 to about 1:10. In some embodiments, the ratio may be about 1:2 to about 1:5. In some embodiments, a difference between the dimension 322 and the dimension 334 may be about 1 nm to about 12 nm. If the ratio is too small (e.g. less than 1:10), or if the difference is too large, the sidewalls of the core-shell feature 224 may be compromised in a subsequent etching operation, thereby exposing the core of the core-shell feature 224. In some embodiments, the top surface of the core-shell feature 224 may be subject to harsher etching conditions than sidewalls of the core-shell feature 224. If the ratio is too large (e.g. greater than about 1:1), or if the difference is too small, the top wall of the core-shell feature 224 may be compromised in a subsequent etching operation, thereby also exposing the core of the core-shell feature 224.

In some embodiments, the core of the core-shell feature 224 may have a lateral dimension 312 and a height dimension 314. In some embodiments, the lateral dimension 312 may be about 5 nm to about 40 nm. In some embodiments, the lateral dimension 312 may be about 8 nm to about 30 nm. In some embodiments, the height dimension 314 may be about 8 nm to about 25 nm. In some embodiments, the height dimension 314 may be about 10 nm to about 20 nm. In some embodiments, a percentage of the volume of the core, as compared to the combined volume of the core and the shell, may be about 1% to about 80%. In some embodiments, the percentage may be about 30% to about 80%. If the percentage is too low, the core-shell feature 224 has properties that may be similar to the bulk features without such core-shell structure. Accordingly, the above-described benefit in reducing the device capacitance may not be effectively achieved. If the percentage is too large, the shell may be too thin, such that the shell may be too easy to damage in subsequent processes, and also thereby losing the benefit of the core-shell structure. In some embodiments, the core-shell feature 224 so formed has an averaged k value (e.g. weighted average of k values based on the volume percentages of the shell portion having a high k value and the volume percentages of the core portion having a low k value) may be about 7 to about 20. In some embodiments, the averaged k value may be about 7.4 to about 15. If the averaged k value is too small, the shell may be too thin to provide the protection function; while if the averaged k value is too large, the cell capacitance may not have been optimized.

Figure 10:
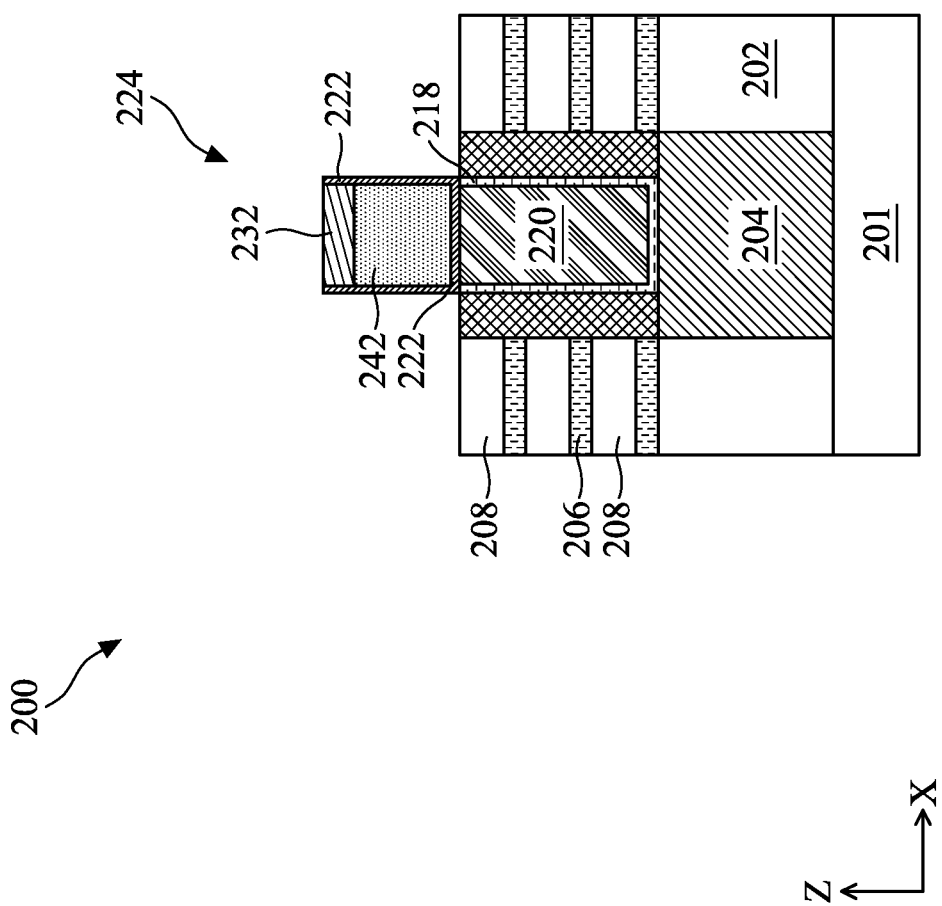

Referring to block 118 of FIG. 2 and to FIG. 10, the top layer 209 is removed without substantially affecting the dielectric layer 222 or the dielectric layer 232. Moreover, the top layer 209 is removed without substantially affecting the channel layer 208. Accordingly, the core-shell feature 224 is exposed and protrudes above the top surface of the topmost channel layer 208. For example, sidewall surfaces of the dielectric layer 222 are exposed. Moreover, a top surface of the channel layer 208 is also exposed. In some embodiments, a bottom surface of the core-shell feature 224 (e.g. a bottom surface of the shell of the core-shell feature 224) extends along or above the top surface of the channel layer 208. In some other approaches not implementing the methods of the present disclosure, the bottom surface of the bulk high-k portion of the hybrid fin structure may extend below the top surface of the topmost channel layer 208. For example, the bulk high-k portion of the hybrid fin structure may have a lower dip portion that extends below the top surface of the topmost channel layer 208. In some circumstances, such dip portion of high-k material may not be easily removed in a subsequent source/drain etching operation. Accordingly, the source/drain features formed therein may not have the maximized volume, and may therefore have an unnecessarily reduced conductivity. Such issue is avoided by implementing embodiments of the present disclosure, as described above. Any suitable methods may be used to remove the top layer 209. In some embodiments, the top layer 209 may implement a dry etching, a wet etching, or a combination thereof.

Figure 11A:
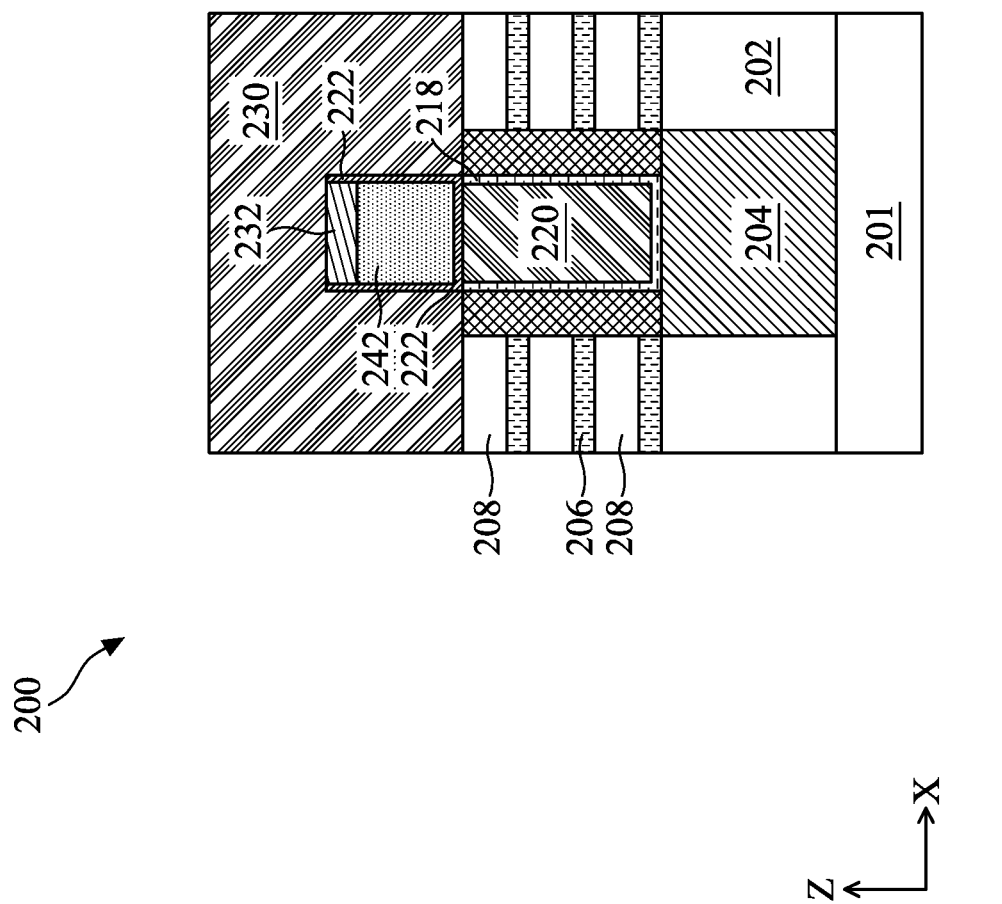
Figure 11B:
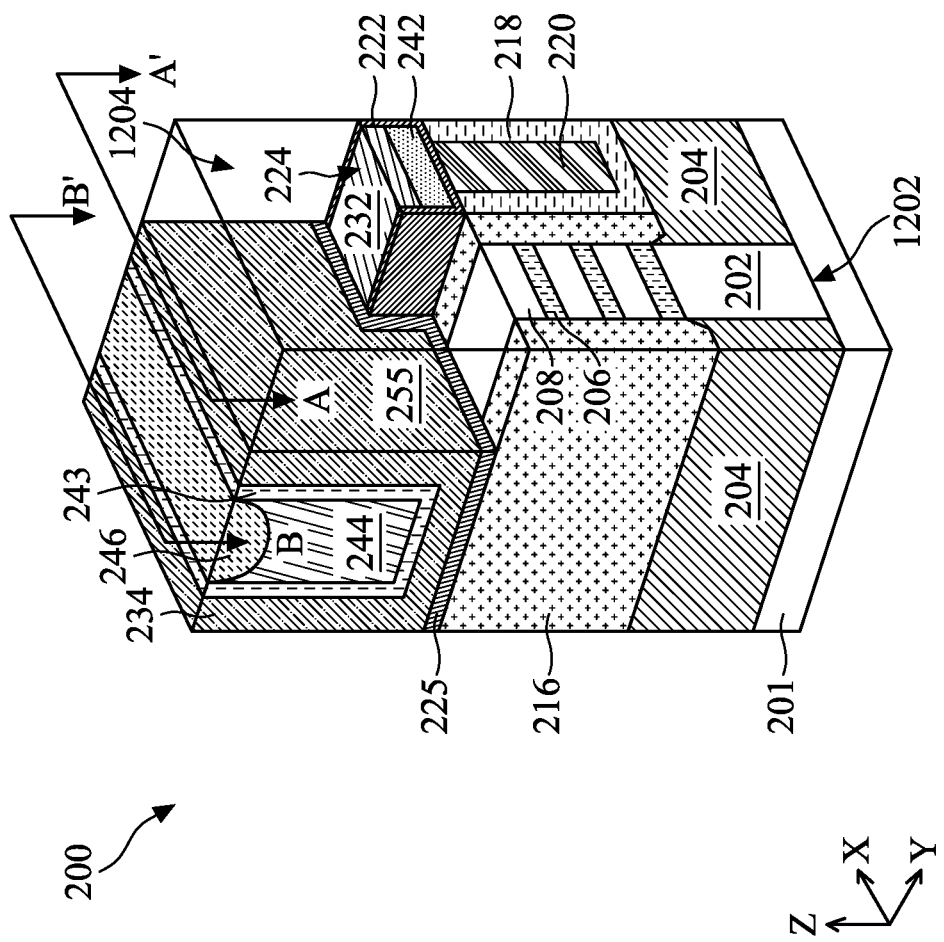
Figure 11C:
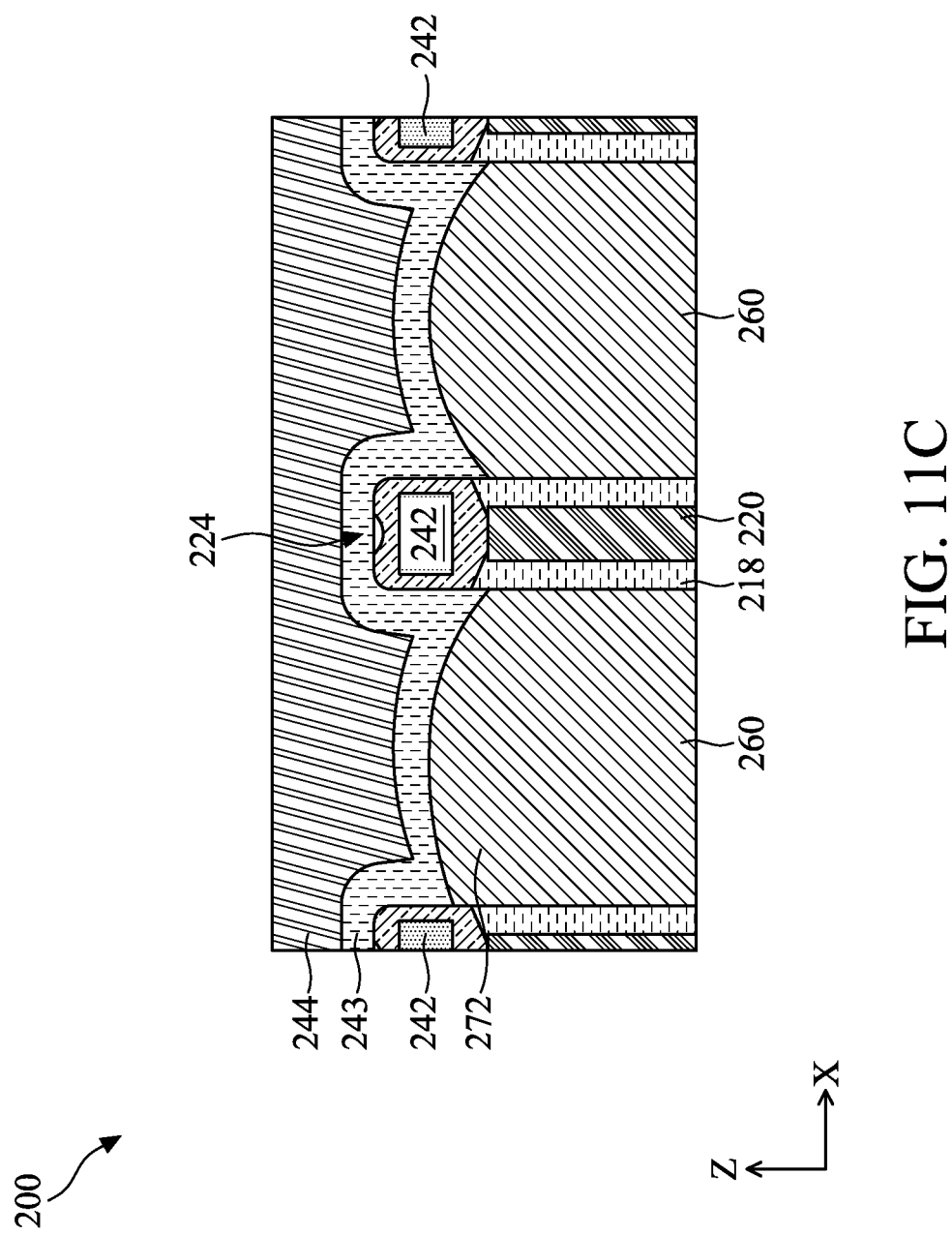
FIGS. 11C and 12C are a fragmentary cross-sectional view of a workpiece (along the B-B' line of FIG. 1B) during a fabrication process according to the method of FIG. 2, according to one or more aspects of the present disclosure.

Referring to blocks 120 of FIG. 2 and to FIGS. 11A-11C, the method 100 proceeds to form dummy gate stacks 230 on the fin structures 1202. In some embodiments, the dummy gate stacks 230 extend orthogonally to the lengthwise direction of the fin structures 1202. For example, in the depicted embodiments, the fin structures 1202 extends along the Y-direction; and the dummy gate stacks 230 extends along the X-direction. In some embodiments, a gate replacement process (or gate-last process) is later implemented where the dummy gate stacks 230 serve as placeholders for subsequently formed functional gate structures. Other processes and configuration are possible. Each of the dummy gate stacks 230 may include a dummy gate electrode layer (such as including polycrystalline silicon (polysilicon) and a dummy gate dielectric layer. In some embodiments, the dummy gate stack 230 may further include other layers such as interfacial layers, hard mask layers, other suitable layers or combinations thereof. Layers for the dummy gate stacks 230 may be formed by any suitable methods, such as CVD, PVD, ALD, other suitable methods, or combinations thereof. Gate spacer 234 is formed wrapping around the top and sidewall surfaces of the dummy gate stacks 230. The gate spacer 234 may include one or more gate spacer layers, where each of the gate spacer layers include a dielectric material, such as a dielectric material that allows selective removal of the dummy gate stacks 230 without affecting the gate spacer 234. Suitable dielectric materials may include SiON, SiCN, SiOC, SiOCN, SiN, other low-k dielectric materials, or combinations thereof. The gate spacer 234 may be conformally deposited over the workpiece 200 using CVD, subatmospheric CVD (SACVD), or ALD. In some embodiments, the gate spacers 234 are etched back.

Thereafter, referring to block 122 of FIG. 2, source/drain trenches are formed on both sides of the dummy gate stacks 230 using an anisotropic etch with the dummy gate stacks 230 and the gate spacers 234 serving as an etch mask. The anisotropic etch may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The source/drain trenches expose sidewall surfaces of the channel layers 208 and the sacrificial layers 206. The sacrificial layers 206 exposed in the source/drain trenches 236 are first selectively and partially recessed to form inner spacer recesses, while the exposed channel layers 208 are substantially unetched due to the etching selectivity. Moreover, a portion of the cladding layer 216 is also etched during the process, for example, because the cladding layer 216 has the same or similar material (e.g. SiGe) as the sacrificial layer 206. An inner spacer material is then deposited using CVD or ALD over the workpiece 200, including over and into the inner spacer recesses. The inner spacer material may include SiON, SiCN, SiOC, SiOCN, SiN, other low-k dielectric materials, or combinations thereof. Subsequently, inner spacer materials outside the inner spacer recesses are etched back, thereby forming the inner spacer features.

Source/drain features 260 are formed in the source/drain trenches as well as the remaining portions of the inner spacer recesses (if any). In some embodiments, the source/drain features 260 may be formed by an epitaxial process, such as vapor-phase epitaxy (VPE), ultra-high vacuum CVD (UHV-CVD), molecular beam epitaxy (MBE), and/or other suitable processes. The source/drain features 260 may be either n-type or p-type. N-type source/drain features 260 may include silicon (Si) and may be doped with an n-type dopant, such as phosphorus (P) or arsenic (As). P-type source/drain features 260 may include silicon germanium (SiGe) or germanium (Ge) and may be doped with a p-type dopant, such as boron (B) or gallium (Ga). In some embodiments, overgrowth of the epitaxy material may cause the source/drain features 260 to merge over the inner spacer features. In some embodiments, referring to FIG. 11C, the presence of the core-shell feature 224 prevents adjacent source/drain features 260 to merge (or bridge) with one another. For example, the source/drain features on both sides of the core-shell feature 224 each have a top surface that extends between a top surface of the core-shell feature 224 and a bottom surface of the core-shell feature 224.

Referring to block 124 of FIG. 2, a contact etch stop layer (CESL) 243 is formed. In an example process, the CESL 243 is first conformally deposited over the workpiece 200 (including, e.g. on the surfaces of the source/drain features 260, as on sidewall surfaces of the dielectric layers 222, and on top surface of the dielectric layer 232). Accordingly, the core-shell features 224 are wrapped by the CESL layer 243 on at least three sides. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. Subsequently, an interlayer dielectric (ILD) layer 244 is blanketly deposited on the CESL 243. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. To remove excess materials and to expose top surfaces of the dummy gate stacks 230, a planarization process (such a chemical mechanical polishing (CMP) process) may be performed to the workpiece 200 to provide a planar top surface. In some embodiments, a hard mask layer 246 is formed on top surfaces of the ILD layer 244 which serves to protect the ILD in subsequent processing. The ILD layer 244 and the hard mask layer 246 are formed on and between side surfaces of the gate spacers 234 of the gate stacks 230.

Figure 12A:
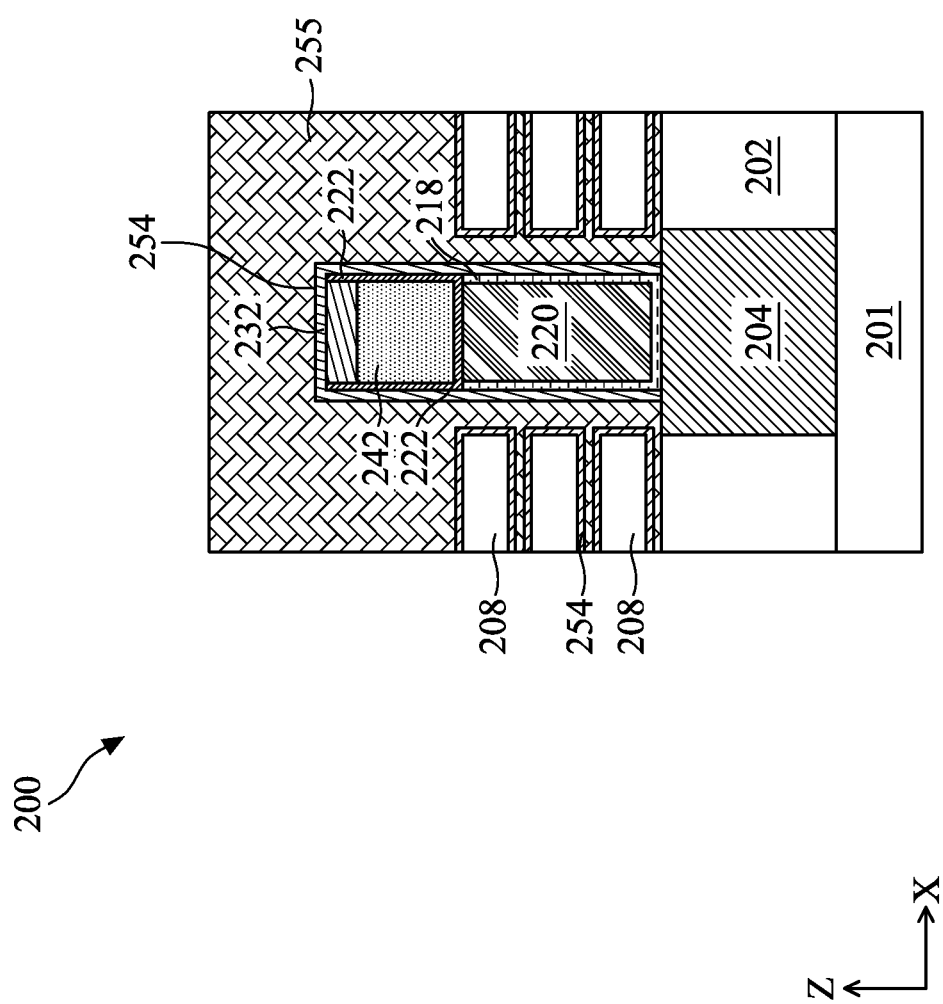
Figure 12B:
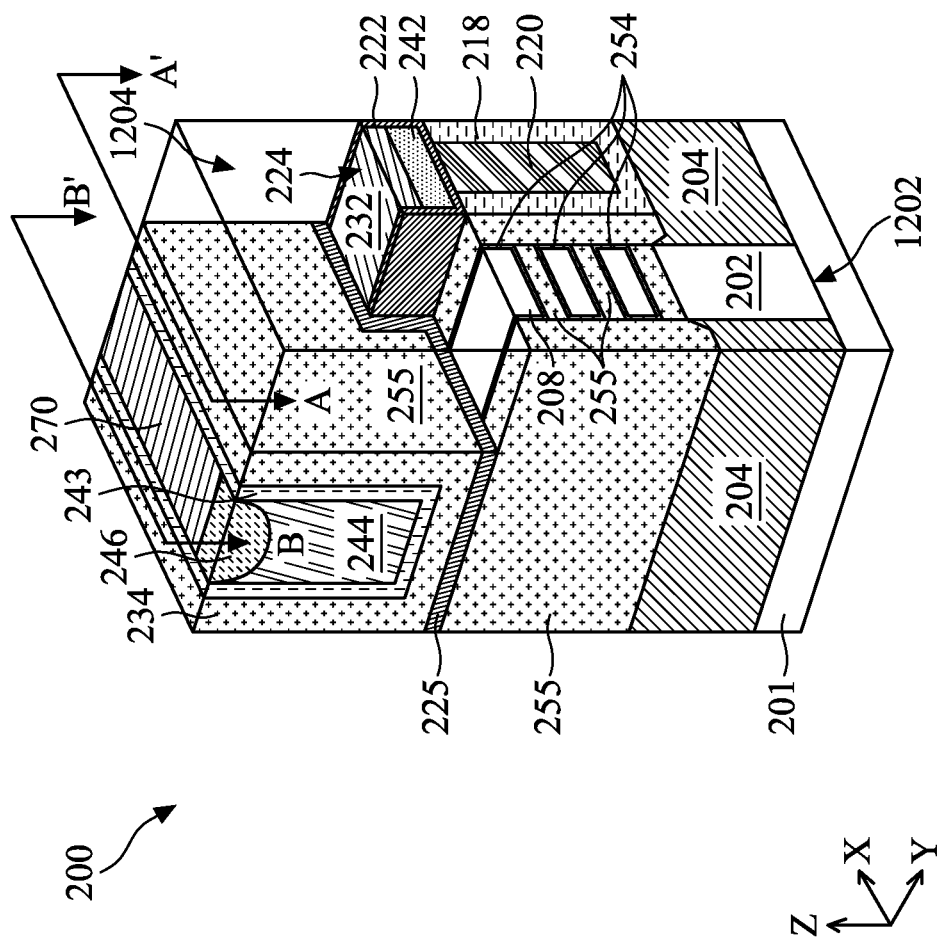
Figure 12C:
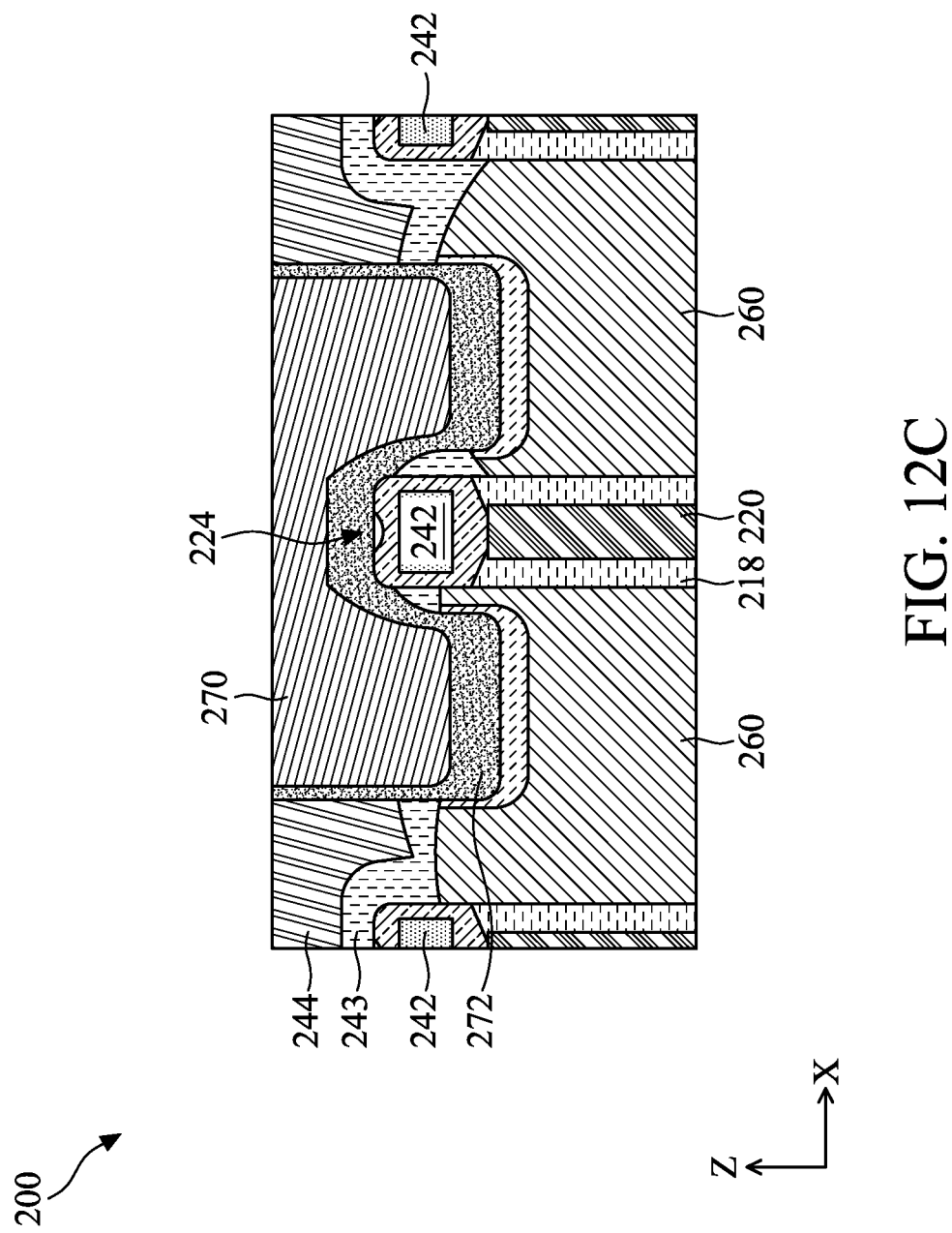

Referring to block 126 of FIG. 2 and to FIGS. 12A-12B, the dummy gate stacks 230 is removed to expose the top surface of the channel layers 208, as well as the top surface of the cladding layer 216. A channel release process (or sometimes referred to as the nanostructure formation process) is conducted, where the cladding layer 216, as well as the sacrificial layers 206 are selectively removed without substantially damaging the channel layers 208 or the dielectric layer 222. In some embodiments, the channel layers 208 may include Si, while the cladding layers 216 as well as the sacrificial layers 206 are each formed of SiGe. Accordingly, the etching parameters may be selected to accomplish the desired selectivity. Following the channel release process, the channel layers 208 are each exposed circumferentially in 360°. Thereafter, replacement gate stacks (such as high-k metal gate stacks) are formed within the gate trenches thereby replacing the removed dummy gate stacks 230. A gate dielectric layer 254 is formed on and surrounding (or wrapping around) each of the channel layers 208. In some embodiments, the gate dielectric layer 254 includes an interfacial layer on and wrapping around the channel layers 208, as well as a high-k gate dielectric layer on and wrapping around the interfacial layer. In some embodiments, the interfacial layer includes silicon oxide. The gate dielectric layer may include a high-k dielectric material, such as include hafnium oxide. Alternatively, the gate dielectric layer 254 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The gate dielectric layer 254 may be formed by any suitable methods, such as CVD, ALD, PVD, other suitable techniques, or combinations thereof. At this processing stage, the dielectric fin 1204 is wrapped around on at these three sides by the gate dielectric layer 254. The gate dielectric layer 254 may have a thickness of about 1.5 nm to about 3 nm.

Moreover, a gate electrode layer 255 is formed on and wrapping around the gate dielectric layer 254. The gate electrode layer 255 may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer 255 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. The gate dielectric layer 254 and the gate electrode 255 collectively form a high-k metal gate stack. The high-k metal gate stack and the gate spacers 234 collectively form the replacement gate structures. In some embodiments, one or more gate self-aligned contact (SAC) dielectric layers are formed to cover the gate structures. In some embodiments, although not specifically depicted, the gate electrode layer 255 may be recessed such that the top surface of the gate electrode layer 255 extends below a top surface of the hybrid fin structure 1204. Accordingly, the core-shell feature 224 (and the hybrid fin structure 1204) cut off the gate structure on the fin structures 1202 into multiple gate portions that are no longer connected to each other.

Furthermore, source/drain contacts 270 are formed over the source/drain features 260. The source/drain contacts 270 may include titanium nitride (TiN), tantalum (Ta), titanium (TiN), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof. In some embodiments, silicides 272 are formed between the source/drain contacts 270 and the source/drain features 260. In the depicted embodiments, referring to FIG. 12C, a portion of the CESL 243 on the top surface of the core-shell feature 224 is removed in the formation of the silicide 272 and/or the source/drain contacts 270. Accordingly, the silicide 272 directly contacts the top surface of the core-shell feature 224. Additionally, referring to block 128 of FIG. 2, the method includes forming further ILD layers, via features, intermetal dielectric (IMD) layers, and/or passivation layers may be formed on the workpiece 200, for example, electrically connected to the source/drain contacts 270. These layers or features are collectively referred to as the MEOL/BEOL features.

As can be seen from the disclosure above, a semiconductor device is provided which includes a hybrid fin structure that has a top portion of a core-shell structure (the core-shell feature 224). The core of the core-shell feature includes a dielectric material that has a k value that is less than about 5. The shell of the core-shell feature includes a material having a high-k dielectric material, and surrounds the core of the core-shell feature. The implementation of the core-shell feature allows a balance between mechanical strength and device capacitance. Accordingly, overall device performance improves.

In one exemplary aspect, the present disclosure is directed to a semiconductor device. The semiconductor device includes a pair of fin structures on a semiconductor substrate, each including a vertically stacked plurality of channel layers, a dielectric fin extending in parallel to and between the fin structures, and a gate structure on and extending perpendicularly to the fin structures, the gate structure engaging with the plurality of channel layers. The dielectric fin includes a fin bottom and a fin top over the fin bottom. The fin bottom has a top surface extending above a bottom surface of a topmost channel layer. The fin top includes a core and a shell, the core having a first dielectric material, the shell surrounding the core and having a second dielectric material different from the first dielectric material. In some embodiments, the first dielectric material has a k value less than silicon oxide, and the second dielectric material has a k value greater than silicon oxide. In some embodiments, an average k value of the fin top is about 7 to about 20. In some embodiments, the shell separates the core from contacting the fin bottom. In some embodiments, the shell directly interfaces with the fin bottom. In some embodiments, a ratio of a height dimension of the shell to a width dimension of the shell is about 0.4 to about 3. In some embodiments, a thickness of the shell is about 0.5 nm to about 5 nm. In some embodiments, the semiconductor device further includes a first source/drain feature and a second source/drain feature on both sides of the dielectric fin. A top surface of the first source/drain feature and a top surface of the second source/drain feature each extend between a top surface of the fin top and a bottom surface of the fin top. In some embodiments, the gate structure includes two gate portions having different compositions, and the fin top extends above a top surface of the two gate portions.

In another exemplary aspect, the present disclosure is directed to a device. The device includes a semiconductor substrate, a first stack of channel layers and a second stack of channel layers each vertically arranged above the semiconductor substrate and extending in parallel with each other, a dielectric fin between the first stack of channel layers and the second stack of channel layers, and a gate structure extending across a top surface of the first stack of channel layers, the second stack of channel layers, and the dielectric fin. The dielectric fin includes a fin top having a bottom surface extending along or above a topmost channel layer. The fin top includes a first dielectric material surrounding a second dielectric material on at least four sides. In some embodiments, the first dielectric material has a k value greater than about 7, and the second dielectric material has a k value less than about 7. In some embodiments, a percentage of a volume of the second dielectric material relative to a sum of the volume of the second dielectric material and a volume of the first dielectric material is about 30% to about 80%. In some embodiments, the fin top has an average k value of about 7 to about 20. In some embodiments, the second dielectric material includes nitrogen and hydrogen.

In yet another exemplary aspect, the present disclosure is directed to a method. The method includes receiving a semiconductor substrate having a first fin structure and a second fin structure formed thereon and extending in parallel to each other, the first fin structure and the second fin structure each including channel layers and sacrificial layers vertically arranged interleavingly, forming a dielectric fin between the first fin structure and the second fin structure, recessing the dielectric fin to form a first trench between the first fin structure and the second fin structure, forming a first dielectric layer on sidewall surfaces of the first trench and on a top surface of the recessed dielectric fin, forming a second dielectric layer on the first dielectric layer and filling the first trench, annealing the second dielectric layer, forming a third dielectric layer covering a top surface of the annealed second dielectric layer, forming source/drain features in the first fin structure and the second fin structure and connected to the respective channel layers, and forming a gate structure on the first fin structure, the second fin structure, and the third dielectric layer, the gate structure engaging withe the channel layers. In some embodiments, the forming of the third dielectric layer includes recessing the annealed second dielectric layer to form a second trench between the first fin structure and the second fin structure, and forming the third dielectric layer on the recessed annealed second dielectric layer and filling the second trench. In some embodiments, the forming of the second dielectric layer includes forming the second dielectric layer having a flowable characteristics and the annealing removes the flowable characteristics. In some embodiments, the annealing of the second dielectric layer includes conducting a first annealing operation in presence of steam at a temperature of about 375° C. to about 425° C., and conducting a second annealing operation in absence of steam at a temperature of about 675° C. to about 725° C. The method includes no other annealing operation between the first annealing operation and the second annealing operation. In some embodiments, the annealing of the second dielectric layer is configured to induce minimal silicon-oxygen (Si—O) bond cleavages. In some embodiments, the receiving of the semiconductor substrate includes receiving the semiconductor substrate having a top layer above the channel layers and the sacrificial layers, and the method further includes removing the top layer after the forming of the third dielectric layer. The forming of the third dielectric layer encloses the second dielectric material within a shell of high-k dielectric materials, the shell including the first dielectric material and the third dielectric material.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a pair of fin structures on a semiconductor substrate, each including a vertically stacked plurality of channel layers;
a dielectric fin extending in parallel to and between the fin structures; and
a gate structure on and extending perpendicularly to the fin structures, the gate structure engaging with the plurality of channel layers,
wherein the dielectric fin includes a fin bottom and a fin top over the fin bottom,
wherein the fin bottom has a top surface extending above a bottom surface of a topmost channel layer, and
wherein the fin top includes a core and a shell, the core having a first dielectric material, the shell surrounding the core and having a second dielectric material different from the first dielectric material.

2. The semiconductor device of claim 1, wherein the first dielectric material has a k value less than silicon oxide, and the second dielectric material has a k value greater than silicon oxide.

3. The semiconductor device of claim 1, wherein an average k value of the fin top is about 7 to about 20.

4. The semiconductor device of claim 1, wherein the shell separates the core from contacting the fin bottom.

5. The semiconductor device of claim 1, wherein the shell directly interfaces with the fin bottom.

6. The semiconductor device of claim 1, wherein a ratio of a height dimension of the shell to a width dimension of the shell is about 0.4 to about 3.

7. The semiconductor device of claim 1, wherein a thickness of the shell is about 0.5 nm to about 5 nm.

8. The semiconductor device of claim 1, further comprising a first source/drain feature and a second source/drain feature on both sides of the dielectric fin, wherein a top surface of the first source/drain feature and a top surface of the second source/drain feature each extend between a top surface of the fin top and a bottom surface of the fin top.

9. The semiconductor device of claim 1, wherein the gate structure includes two gate portions having different compositions, and the fin top extends above a top surface of the two gate portions.

10. A device, comprising:
a semiconductor substrate;
a first stack of channel layers and a second stack of channel layers each vertically arranged above the semiconductor substrate and extending in parallel with each other;
a dielectric fin between the first stack of channel layers and the second stack of channel layers; and
a gate structure extending across a top surface of the first stack of channel layers, the second stack of channel layers, and the dielectric fin,
wherein the dielectric fin includes a fin top having a bottom surface extending along or above a topmost channel layer, and
wherein the fin top includes a first dielectric material surrounding a second dielectric material on at least four sides.

11. The device of claim 10, wherein the first dielectric material has a k value greater than about 7, and the second dielectric material has a k value less than about 7.

12. The device of claim 10, wherein a percentage of a volume of the second dielectric material relative to a sum of the volume of the second dielectric material and a volume of the first dielectric material is about 30% to about 80%.

13. The device of claim 10, wherein the fin top has an average k value of about 7 to about 20.

14. The device of claim 10, wherein the second dielectric material includes nitrogen and hydrogen.

15. A semiconductor device, comprising:
a substrate;
a first plurality of channel layers vertically stacked and suspended above the substrate;
a second plurality of channel layers vertically stacked and suspended above the substrate;
an isolation structure disposed on the substrate and between the first plurality of channel layers and the second plurality of channel layers; and
a dielectric fin disposed on the isolation structure and between the first plurality of channel layers and the second plurality of channel layers,
wherein:
the dielectric fin includes a fin bottom and a fin top,
the fin bottom includes a first outer layer of a first dielectric constant and a first inner layer of a second dielectric constant that is smaller than the first dielectric constant, and
the fin top includes a second outer layer of a third dielectric constant and a second inner layer of a fourth dielectric constant that is smaller than the third dielectric constant.

16. The semiconductor device of claim 15, wherein the fourth dielectric constant is less than the second dielectric constant.

17. The semiconductor device of claim 15, wherein the second inner layer is fully surrounded by the second outer layer in a cross-sectional view perpendicular to a top surface of the substrate.

18. The semiconductor device of claim 17, wherein the first inner layer is in physical contact with the second outer layer.

19. The semiconductor device of claim 15, wherein the second inner layer includes silicon and oxygen, and the fourth dielectric constant is less than that of silicon oxide.

20. The semiconductor device of claim 15, further comprising:
a first epitaxial feature abutting the first plurality of channel layers; and
a second epitaxial feature abutting the second plurality of channel layers,
wherein the first epitaxial feature is spaced apart from the second epitaxial feature with the dielectric fin therebetween.

* * * * *